US011647633B2

(12) United States Patent
Jhothiraman et al.

(10) Patent No.: US 11,647,633 B2
(45) Date of Patent: May 9, 2023

(54) METHODS USED IN FORMING INTEGRATED CIRCUITRY COMPRISING A STACK COMPRISING VERTICALLY-ALTERNATING FIRST TIERS AND SECOND TIERS WITH THE STACK COMPRISING A CAVITY THEREIN THAT COMPRISES A STAIR-STEP STRUCTURE

(71) Applicant: Micron Technology, Inc., Boise, ID (US)

(72) Inventors: Jivaan Kishore Jhothiraman, Meridian, ID (US); John Mark Meldrim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 16/927,293

(22) Filed: Jul. 13, 2020

(65) Prior Publication Data

US 2022/0013530 A1 Jan. 13, 2022

(51) Int. Cl.
*H01L 27/1157* (2017.01)
*H01L 27/11565* (2017.01)
*H01L 27/11582* (2017.01)

(52) U.S. Cl.
CPC .... *H01L 27/1157* (2013.01); *H01L 27/11565* (2013.01); *H01L 27/11582* (2013.01)

(58) Field of Classification Search
CPC ........................................ H01L 27/115–11597
See application file for complete search history.

(56) References Cited

U.S. PATENT DOCUMENTS

| 9,536,982 | B1* | 1/2017 | Cheng | ................... H01L 29/517 |
| 9,543,319 | B1 | 1/2017 | Wu et al. | |
| 10,269,625 | B1* | 4/2019 | Matovu | ............. H01L 21/76819 |
| 10,304,852 | B1 | 5/2019 | Cui et al. | |
| 2011/0289924 | A1* | 12/2011 | Pietsch | ............... F28D 20/0056 |
| | | | | 165/10 |

(Continued)

FOREIGN PATENT DOCUMENTS

| JP | 2017-054989 | 3/2017 |
| KR | 10-2019-0006142 | 1/2019 |
| WO | WO PCT/US2021/041232 | 10/2021 |

OTHER PUBLICATIONS

U.S. Appl. No. 17/851,393, filed Jun. 28, 2022, by Jhothiraman.
U.S. Appl. No. 17/944,343, filed Sep. 14, 2022, by Jhothiraman et al.

*Primary Examiner* — Allen L Parker
*Assistant Examiner* — Gustavo G Ramallo
(74) *Attorney, Agent, or Firm* — Wells St. John P.S.

(57) ABSTRACT

A method used in forming integrated circuitry comprises forming a stack comprising vertically-alternating first tiers and second tiers. The stack comprises a cavity therein that comprises a stair-step structure. Sidewalls of the cavity and steps of the stair-step structure are lined with an insulator material. Insulative material is formed in the cavity radially inward of the insulator material. An upper portion of the insulative material is removed from the cavity to leave the insulative material in a bottom of the cavity over the stair-step structure. After the removing, insulating material is formed in the cavity above the insulative material. Other embodiments, including structure independent of method, are disclosed.

12 Claims, 25 Drawing Sheets

(56) References Cited

U.S. PATENT DOCUMENTS

| | | |
|---|---|---|
| 2013/0334591 A1 | 12/2013 | Matsuda |
| 2015/0060988 A1* | 3/2015 | Lee ................... H01L 27/1157 257/329 |
| 2016/0284727 A1* | 9/2016 | Sonehara ......... H01L 27/11575 |
| 2017/0077122 A1 | 3/2017 | Ono |
| 2017/0154895 A1* | 6/2017 | Huo ................. H01L 27/11556 |
| 2018/0151588 A1* | 5/2018 | Tsutsumi ............ H01L 29/0847 |
| 2018/0330985 A1 | 11/2018 | Yu et al. |
| 2019/0013237 A1 | 1/2019 | Nam et al. |
| 2020/0203220 A1 | 6/2020 | Matovu et al. |
| 2021/0134736 A1* | 5/2021 | Jhothiraman ..... H01L 21/76831 |
| 2021/0335803 A1 | 10/2021 | Tiwari et al. |

* cited by examiner

METHODS USED IN FORMING INTEGRATED CIRCUITRY COMPRISING A STACK COMPRISING VERTICALLY-ALTERNATING FIRST TIERS AND SECOND TIERS WITH THE STACK COMPRISING A CAVITY THEREIN THAT COMPRISES A STAIR-STEP STRUCTURE

TECHNICAL FIELD

Embodiments disclosed herein pertain to integrated circuitry and to methods used in forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
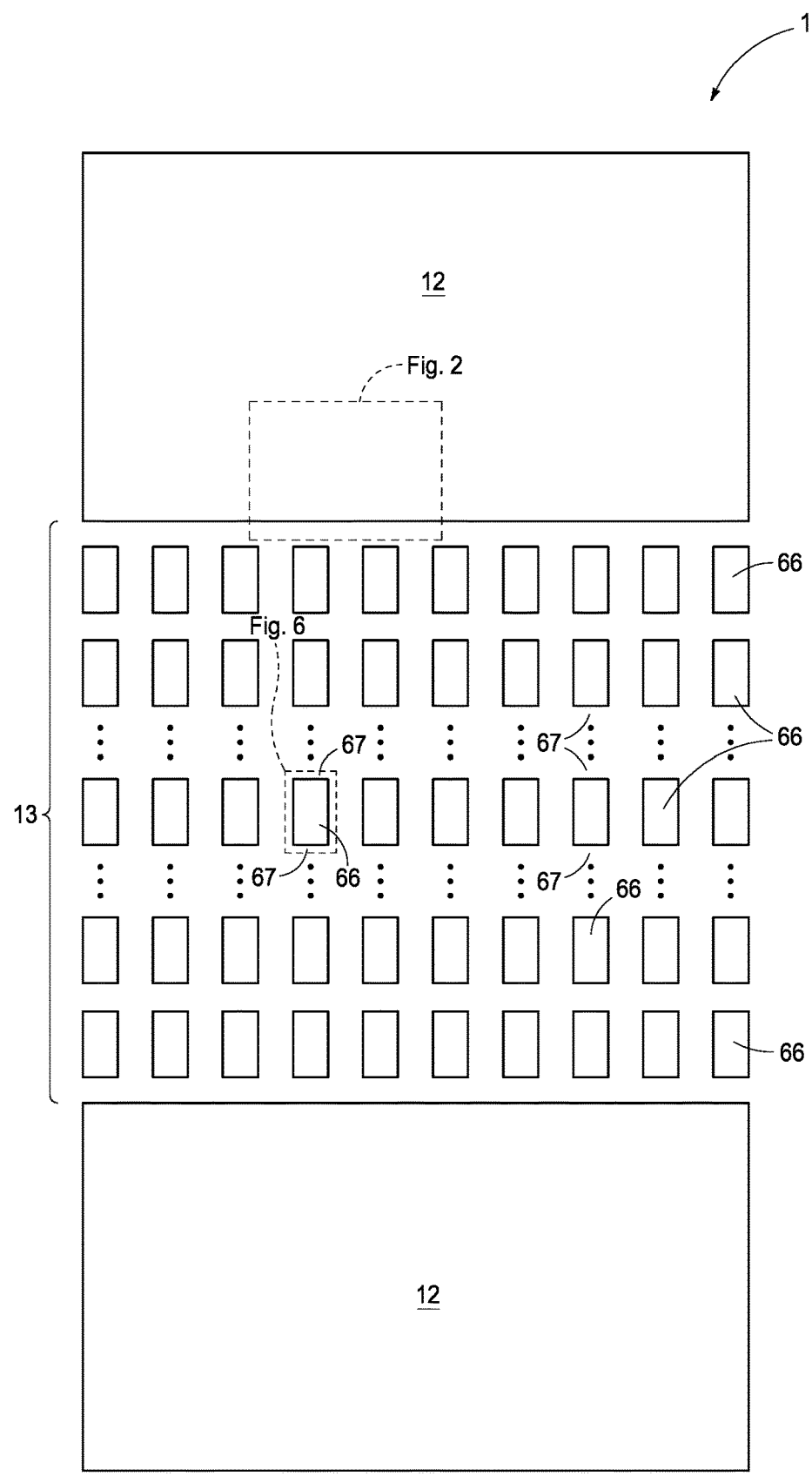
FIG. 1 is a diagrammatic view of a portion of a substrate in process in accordance with an embodiment of the invention.
Figure 2:
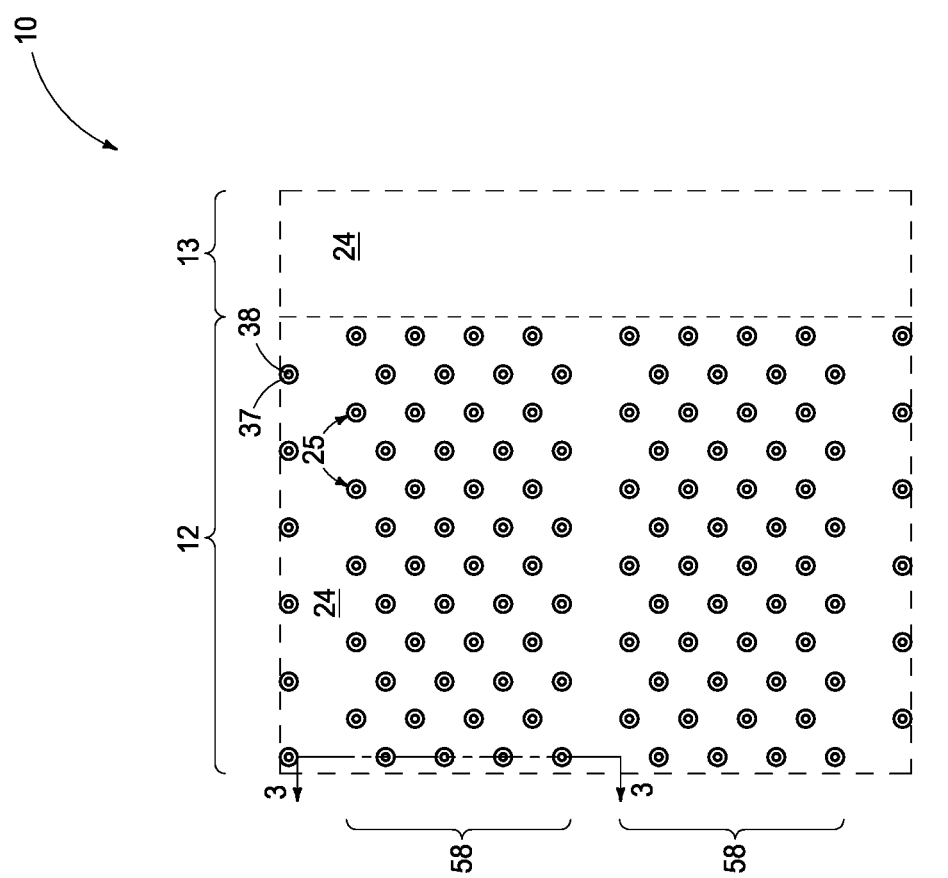
FIG. 2 is an enlarged diagrammatic section view of a portion of FIG. 1 and is taken through line 2-2 in FIG. 3.

Embodiments of the invention encompass methods used in forming integrated circuitry, for example memory circuitry, logic circuitry, or other existing or future-developed integrated circuitry. In one example, such integrated circuitry comprises a memory array such as an array of NAND or other memory cells that may have at least some peripheral control circuitry under the array (e.g., CMOS-under-array). Embodiments of the invention also encompass existing or future-developed integrated circuitry independent of method of manufacture, for example memory circuitry comprising a memory array (e.g., NAND architecture). Example method embodiments are described first, with reference to FIGS. 1-28 which may be considered as a "gate-last" or "replacement-gate" process in the forming of memory circuitry, and starting with FIGS. 1-5.

FIGS. 1-5 show a construction 10 having two memory-array regions 12 in which elevationally-extending strings of transistors and/or memory cells will be formed. A stair-step region 13 is between memory-array regions 12 and in which one or more stair-step structures have been or will be formed. Example construction 10 comprises a base substrate 11 having any one or more of conductive/conductor/conducting, semi conductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Alternately or additionally, at least one of the depicted uppermost and lowest conductive tiers 22 may be a select gate tier. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-5 show one embodiment where charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual openings 25 followed by planarizing such back at least to a top surface of stack 18.

Channel material 36 has also been formed in channel openings 25 elevationally along insulative tiers 20 and conductive tiers 22, thus comprising individual operative channel-material strings 53 in channel openings 25. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

The above processing is but one example of forming channel-material strings 53 in a memory-array region 12. Alternate existing or future-developed techniques may be used and example channel-material strings 53 may be fabricated later in processing than as shown.

Figure 3:
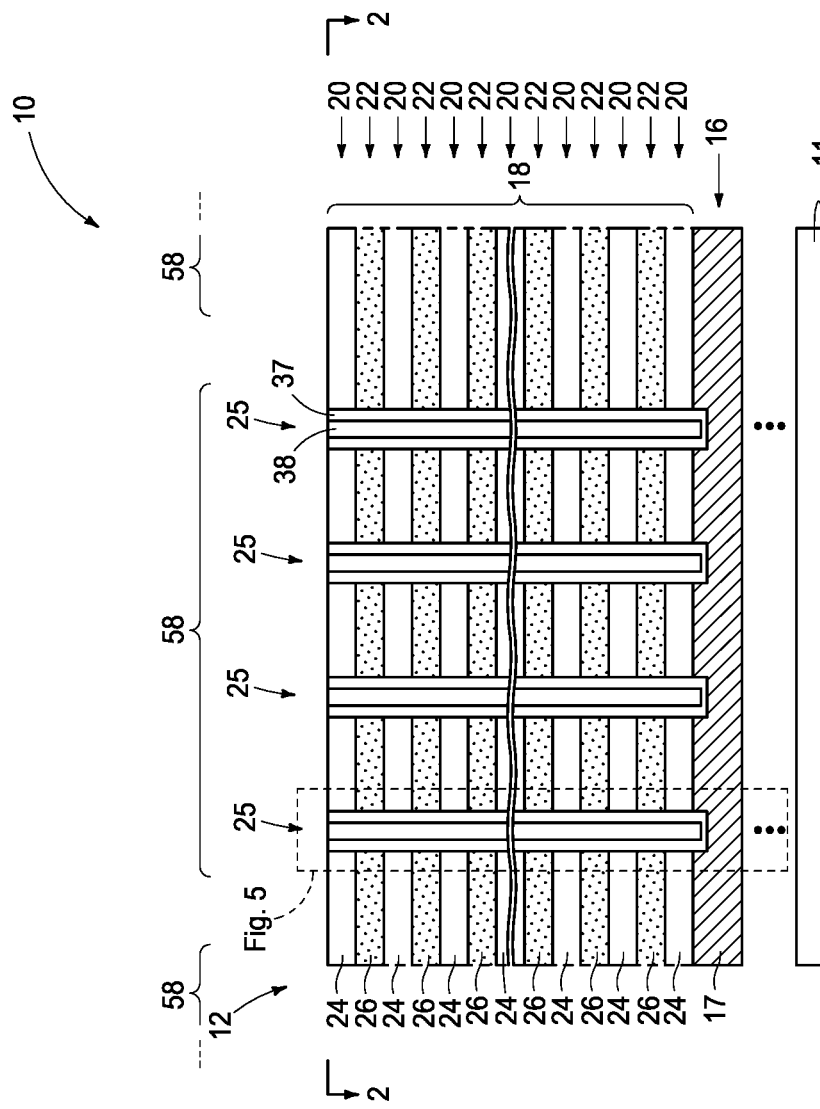
FIG. 3 is a diagrammatic section view taken through line 3-3 in FIG. 2.
Figure 4:
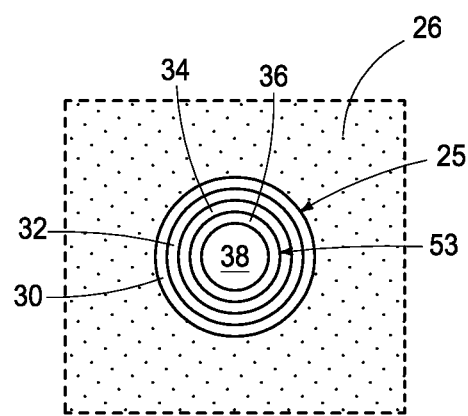
FIG. 4 is a section view taken through line 4-4 in FIG. 5.
Figure 5:
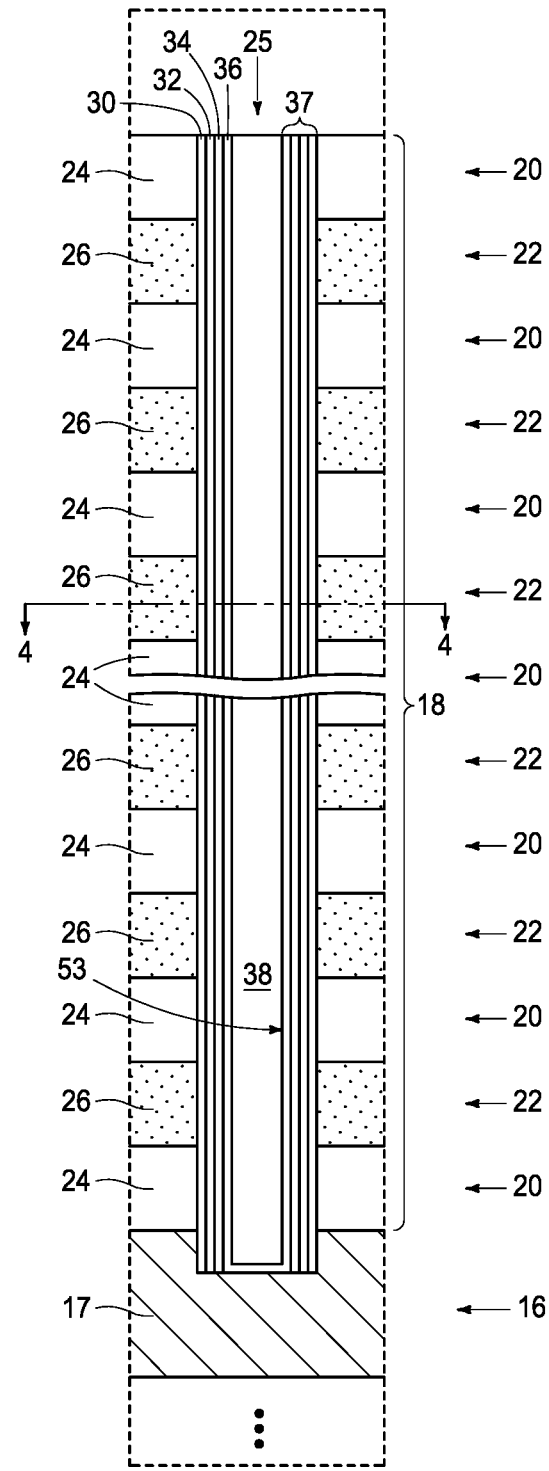
FIG. 5 is an enlarged view of a portion of FIG. 3.
Figure 6:
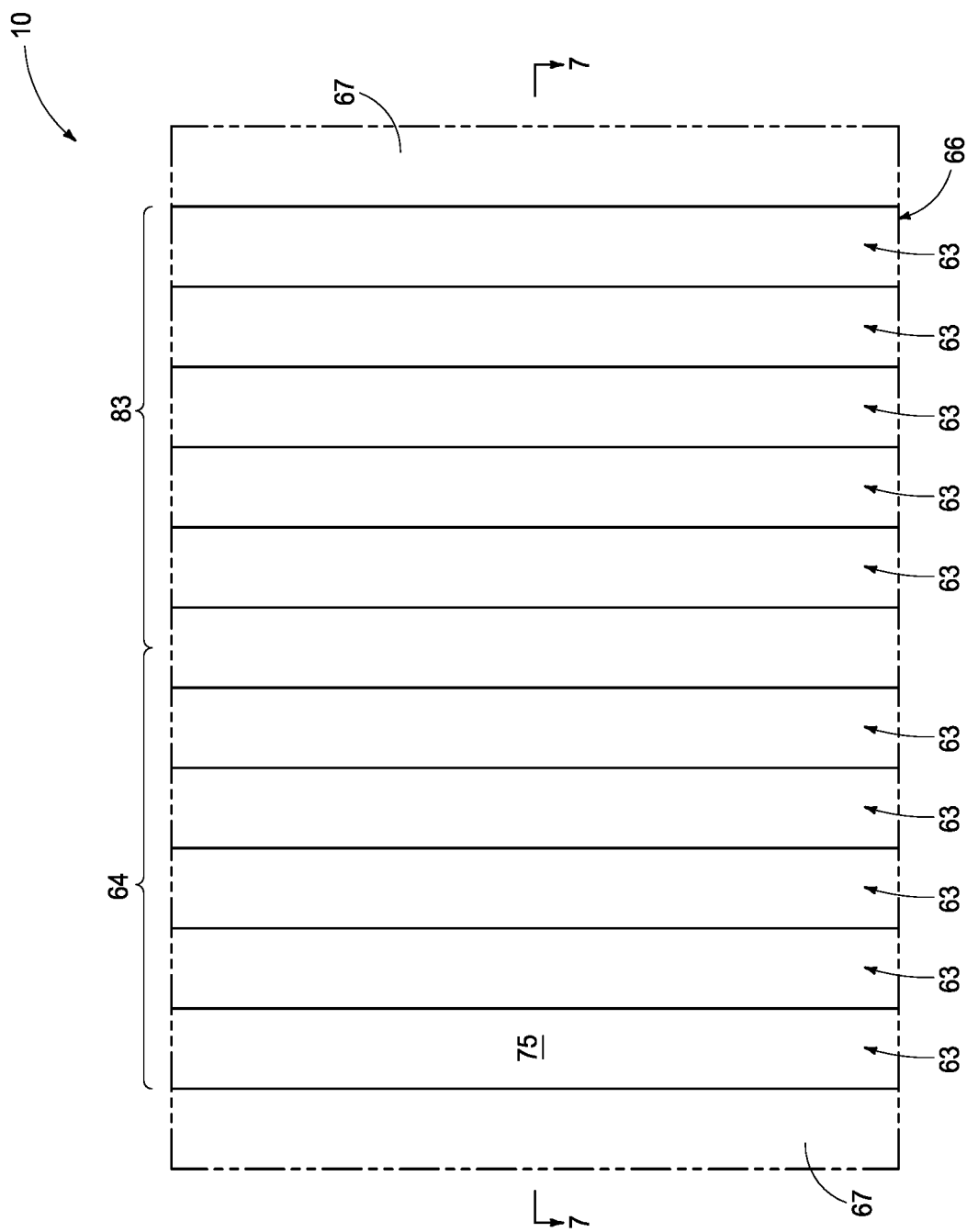
FIG. 6 is an enlarged view of a portion of FIG. 1.
Figure 7:
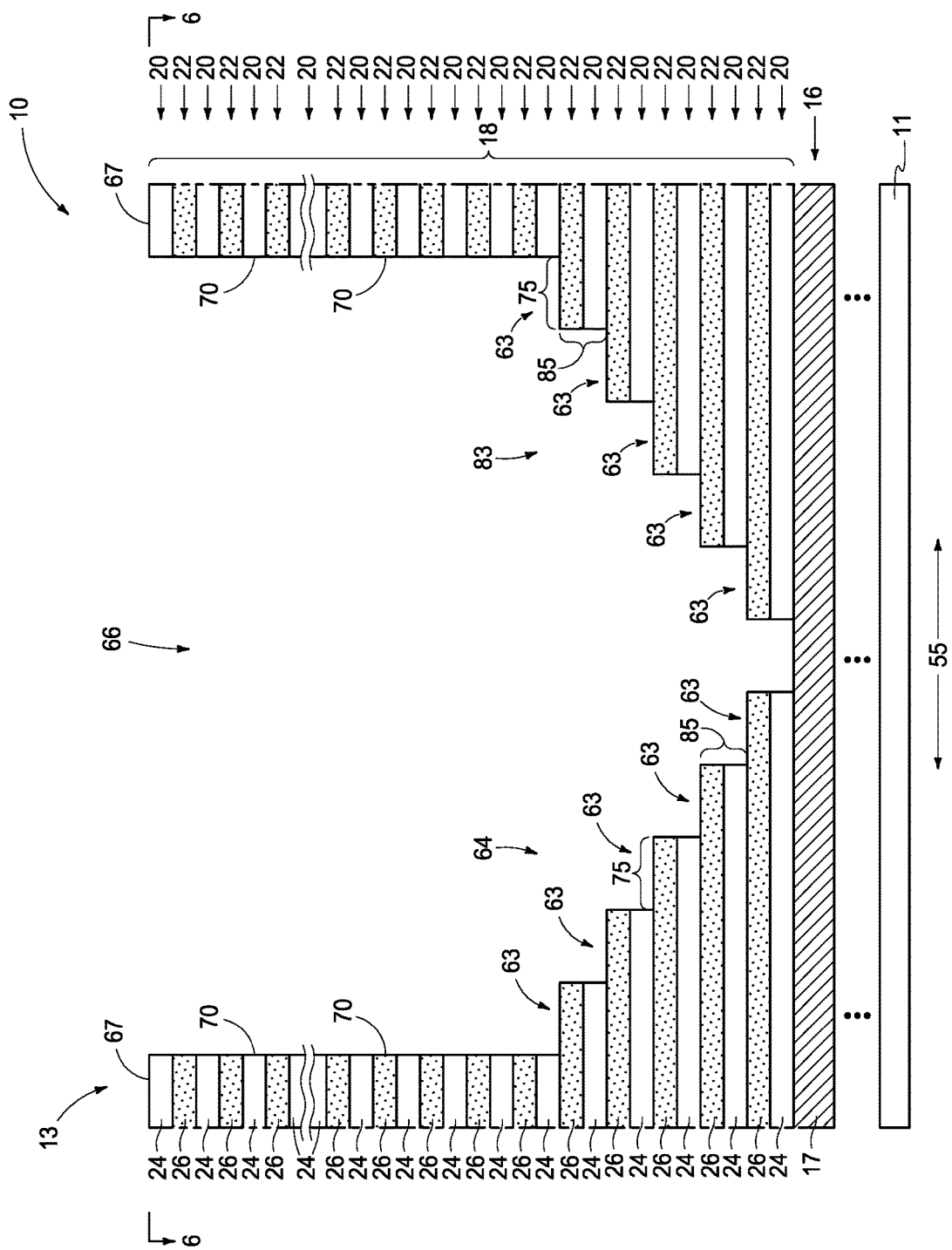
FIG. 7 is a diagrammatic section view taken through line 7-7 in FIG. 6.

Referring to FIGS. 1, 6, and 7, and in one embodiment, an array of multiple cavities 66 has been formed in stair-step region 13 and that individually comprise a stair-step structure as described below. Example cavities 66 are aligned longitudinally end-to-end in individual memory-block regions 58 and have a crest 67 between immediately-adjacent cavities 66. Alternately, only a single cavity may be in individual memory-block regions 58 (not shown). Nevertheless, method and structure embodiments include fabrication of and a resultant construction having only a single cavity 66 and the discussion largely proceeds with respect to a single cavity 66. Cavities 66 are shown as being rectangular in horizontal cross-section, although other shape(s) may be used and all need not be of the same shape relative one another. For brevity, less tiers 20 and 22 are shown in FIGS. 3 and 5 as compared to FIG. 7, with more tiers 20 and 22 being shown in FIG. 7 for clarity and better emphasis of depth of cavities 66.

Cavities 66 individually comprise a stair-step structure 64, for example that has steps 63 that individually comprise a tread 75 and a riser 85. Example stair-step structure 64 in the example "gate-last" method is circuit-inoperative but may comprise an operative stair-step structure in a finished-circuitry construction. An "operative stair-step structure" is circuit-operative having at least some conductive step thereof that electrically couples with and between a) an electronic component in memory-array region 12, such as a transistor and/or memory cell, and b) an electronic component outside of memory-array region 12. Stair-step structure 64 may be formed by any existing or later-developed method(s). As one such example, a masking material (e.g., a photo-imagable material such as photoresist) may be formed atop stack 18 and an opening formed there-through. Then, the masking material may be used as a mask while etching (e.g., anisotropically) through the opening to extend such opening into at least two outermost tiers 20, 22. The resultant construction may then be subjected to a successive alternating series of lateral-trimming etches of the masking material followed by etching deeper into stack 18, two-tiers 20, 22 at a time, using the trimmed masking material having a successively widened opening as a mask. Such an example may result in the forming of stair-step structure 64 into stack 18 that comprises vertically alternating tiers 20, 22 of different composition materials 24, 26, and in the forming of another stair-step structure 83 opposite and facing stair-step structure 64 (e.g., in mirror image and as shown). Such opposite stair-step structure 83 may be a dummy stair-step structure in a finished circuitry construction. A "dummy stair-step structure" is circuit-inoperative having steps thereof in which no current flows in conductive material of the steps and which may be a circuit-inoperable dead end that is not part of a current flow path of a circuit even if extending to or from an electronic component. Operative vs. inoperative relative to stair-step structures 64 and 83 may of course be reversed. Multiple operative stair-step structures and multiple dummy stair-step structures may be formed in multiple cavities 66, for example longitudinally end-to-end as shown and to different depths within stack 18. Pairs of opposing mirror-image operative and dummy stair-step structures may be considered as defining a stadium (e.g., a vertically recessed portion having opposing flights of stairs as shown). Alternately, only a single stair-step structure 64 or 83 may be formed (not shown) in one or more individual cavities 66. Regardless, cavities 66 may be formed before or after forming channel-material strings 53. Cavities 66 may be considered as having sidewalls 70 and 85 (where risers 85 are present such effectively are part of the sidewalls of cavities 66).

Figure 8:
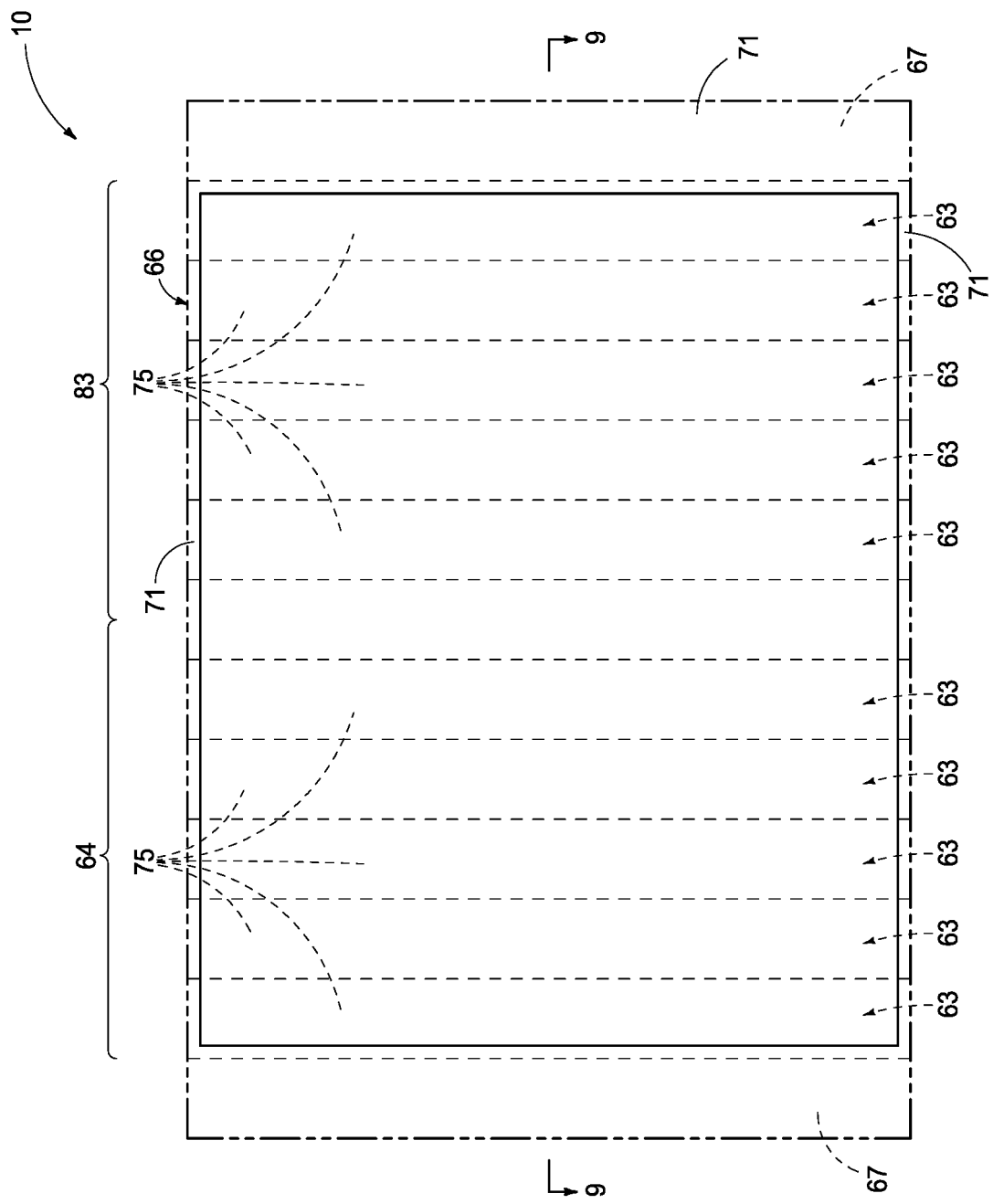
FIGS. 8-16 and 19-28 are diagrammatic sequential sectional, expanded, enlarged, and/or partial views of the construction of FIGS. 1-7, or portions thereof, in process in accordance with some embodiments of the invention.
Figure 9:
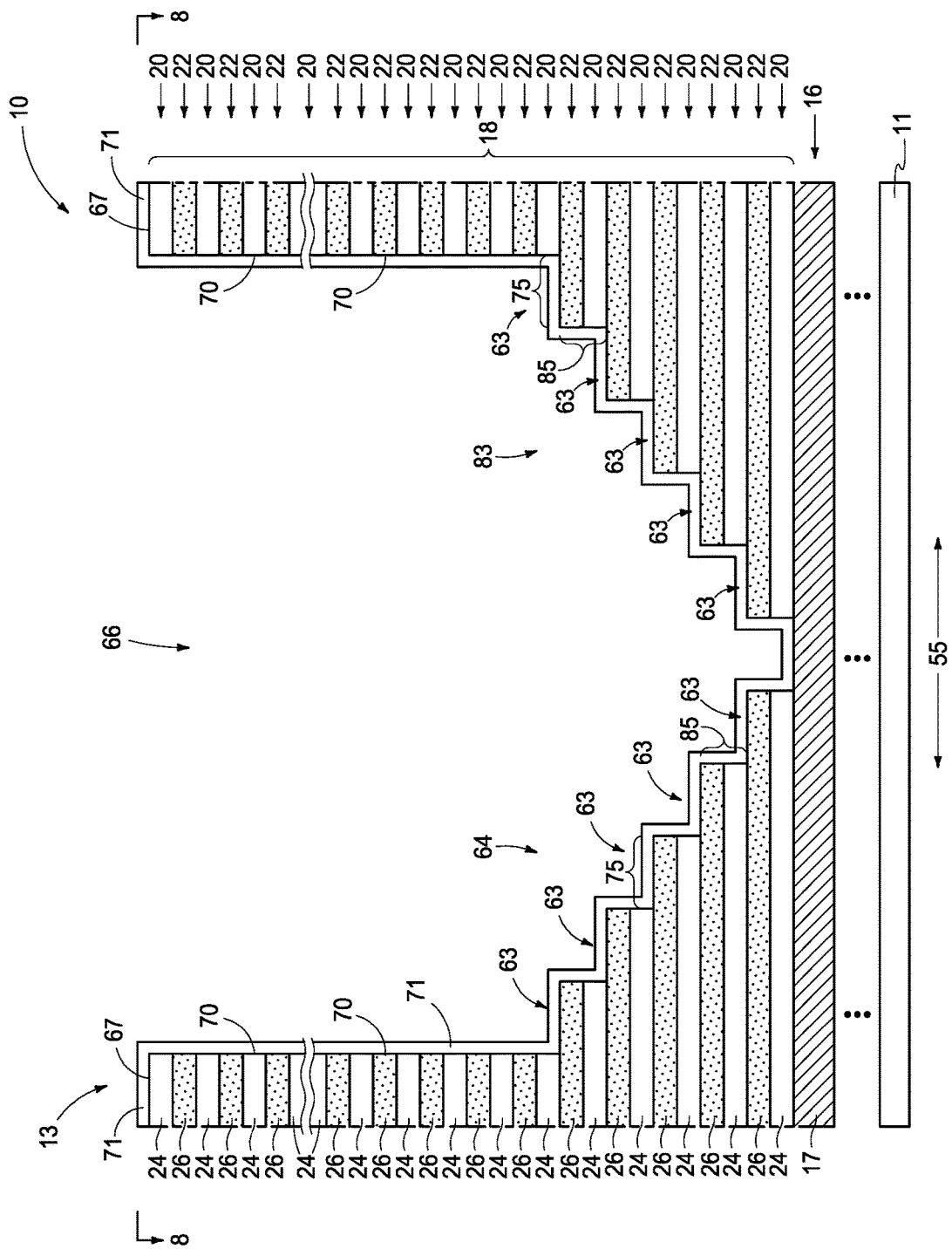

Referring to FIGS. 8 and 9, sidewalk 70/85 of cavity 66 and steps 63 of stair-step structure 64 (e.g., and 83 when present) have been lined with an insulator material 71. In one embodiment, insulator material 71 is of different composition from those of first and second tiers 22, 20 respectively (e.g., of different composition from materials 24 and 26). In one such embodiment, one of the first and second tiers (second tiers 20) collectively comprises silicon dioxide (e.g., 24), and insulator material 71 is at least one of $Si_xO_yC_z$, porous carbon, aluminum oxide, and undoped elemental-formed silicon. (e.g., in one or more than one layer; i.e., "undoped" herein meaning from 0 atoms/cm$^3$ to $1 \times 10^{12}$ atoms/cm$^3$ of conductivity-modifying dopant). In one embodiment, insulator material 71 has a thickness that is less than each of height of risers 85 and depth of treads 75, for example as shown. Alternately, the thickness of the insulator material may be greater than at least one of the height of the risers and the depth of the treads (not shown).

Figure 10:
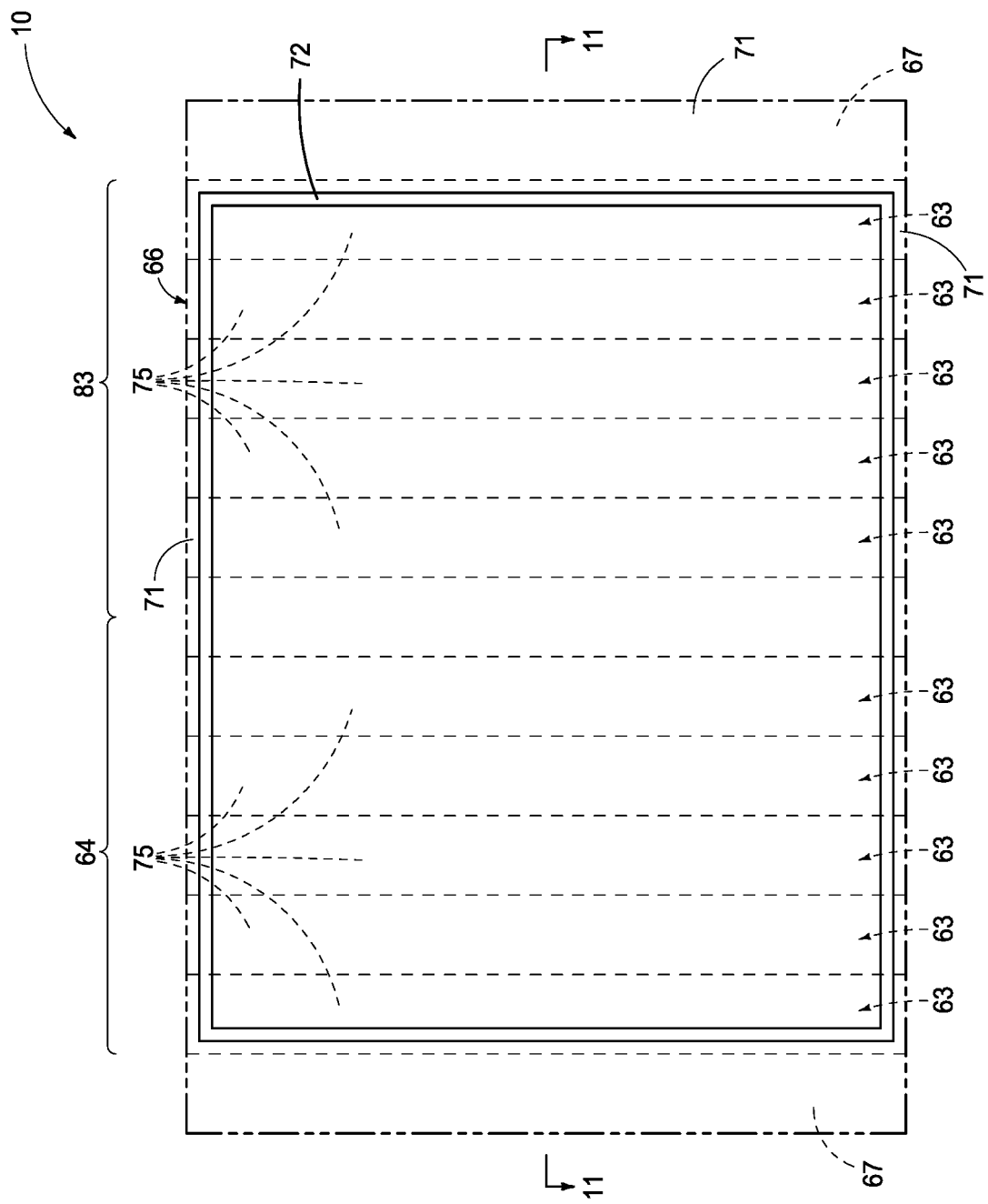
Figure 11:
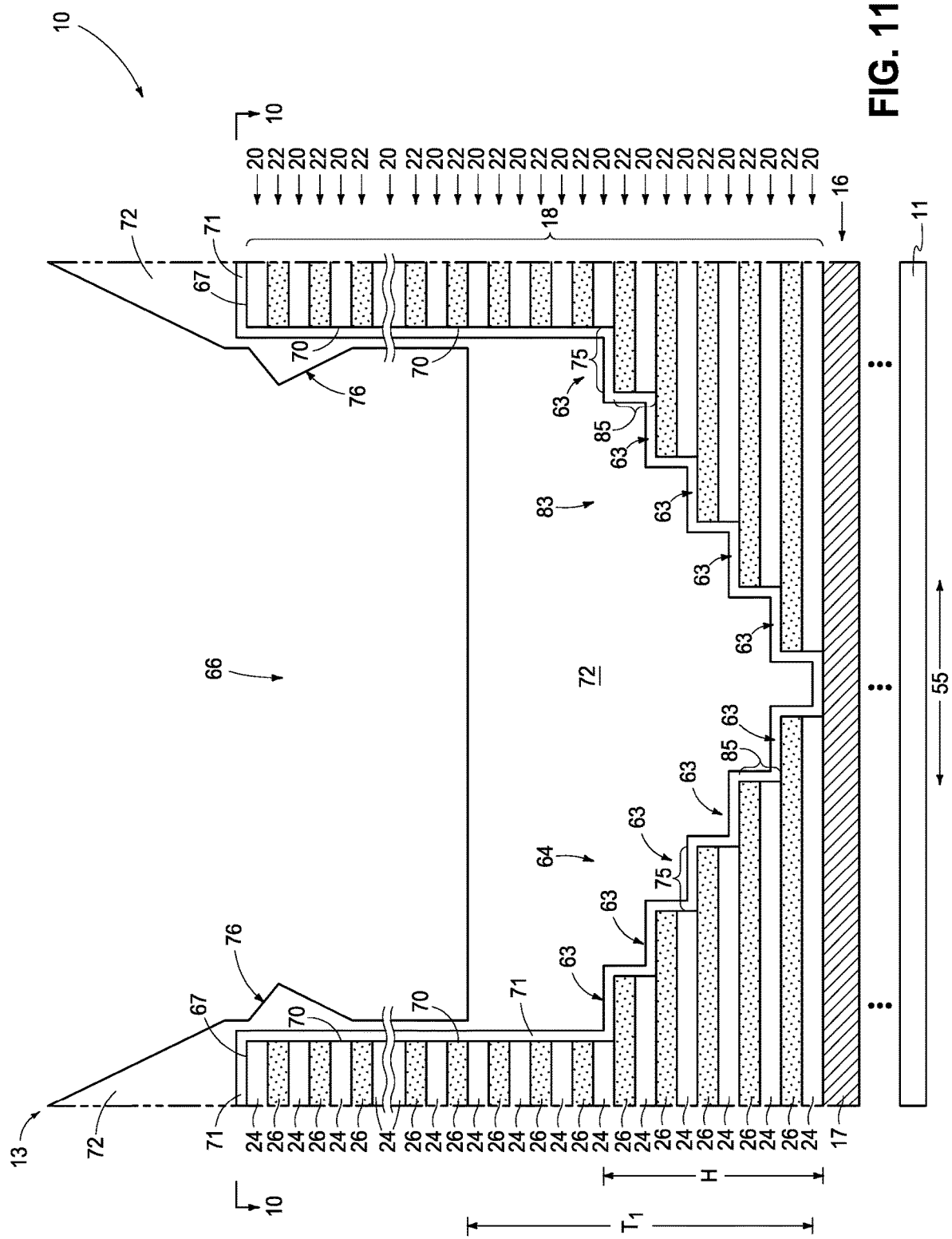

Referring to FIGS. 10 and 11, insulative material 72 has been formed in cavity 66 radially inward of insulator material 71. In one embodiment, insulator material 71 and insulative material 72 are of different compositions relative one another and in one embodiment insulative material 72 is formed atop stack 18 aside cavity 66 when forming insulative material 72 in cavity 66 radially inward of insulator material 71. In one embodiment, insulative material 72 is formed in cavity 66 to a thickness $T_1$ that is greater than height H of stair-step structure 64. In one embodiment and as shown, a pair of opposing lateral projections 76 may be formed in cavity 66 in a vertical cross-section (e.g., that of FIG. 11). Ideally, formation of insulative material 72 within cavity 66 is conducted in some existing or future-manner that results in a deposition/growth rate of insulative material 72 that is greater from the bottom of cavity 66 than from sidewalls 70/85 thereof. As but one example, high-density-plasma deposition within an inductively coupled plasma reactor of silicon dioxide may be used. Example precursor feed gasses are various combinations of silane, tetraethyl-orthosilicate, oxygen, ozone, and nitrous oxide. Example other parameters include pressure of 10 mTorr to 500 Torr, susceptor temperature of 350° C. to 700° C., and power of 1,000 watts to 10,000 watts.

Figure 12:
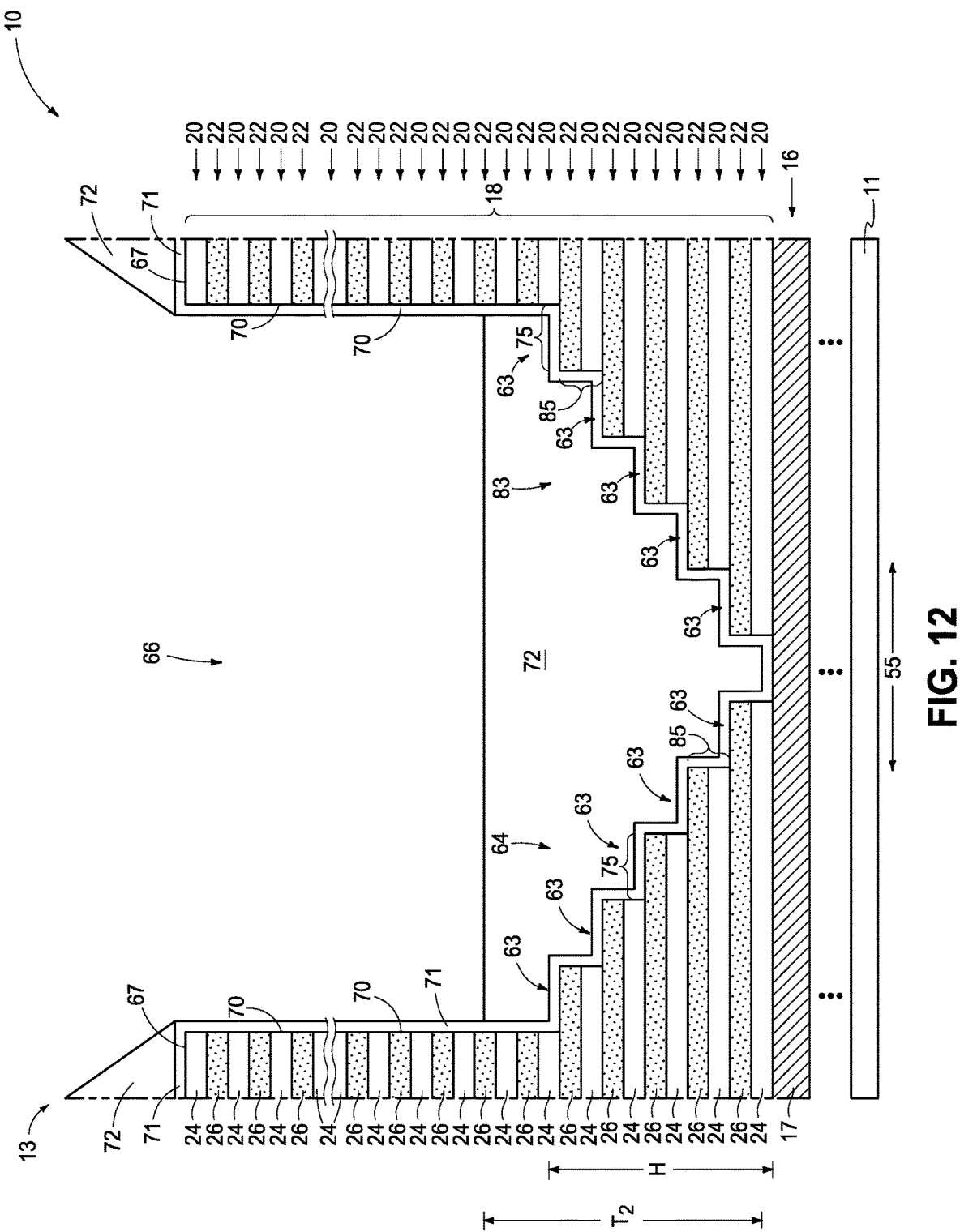
Figure 13:
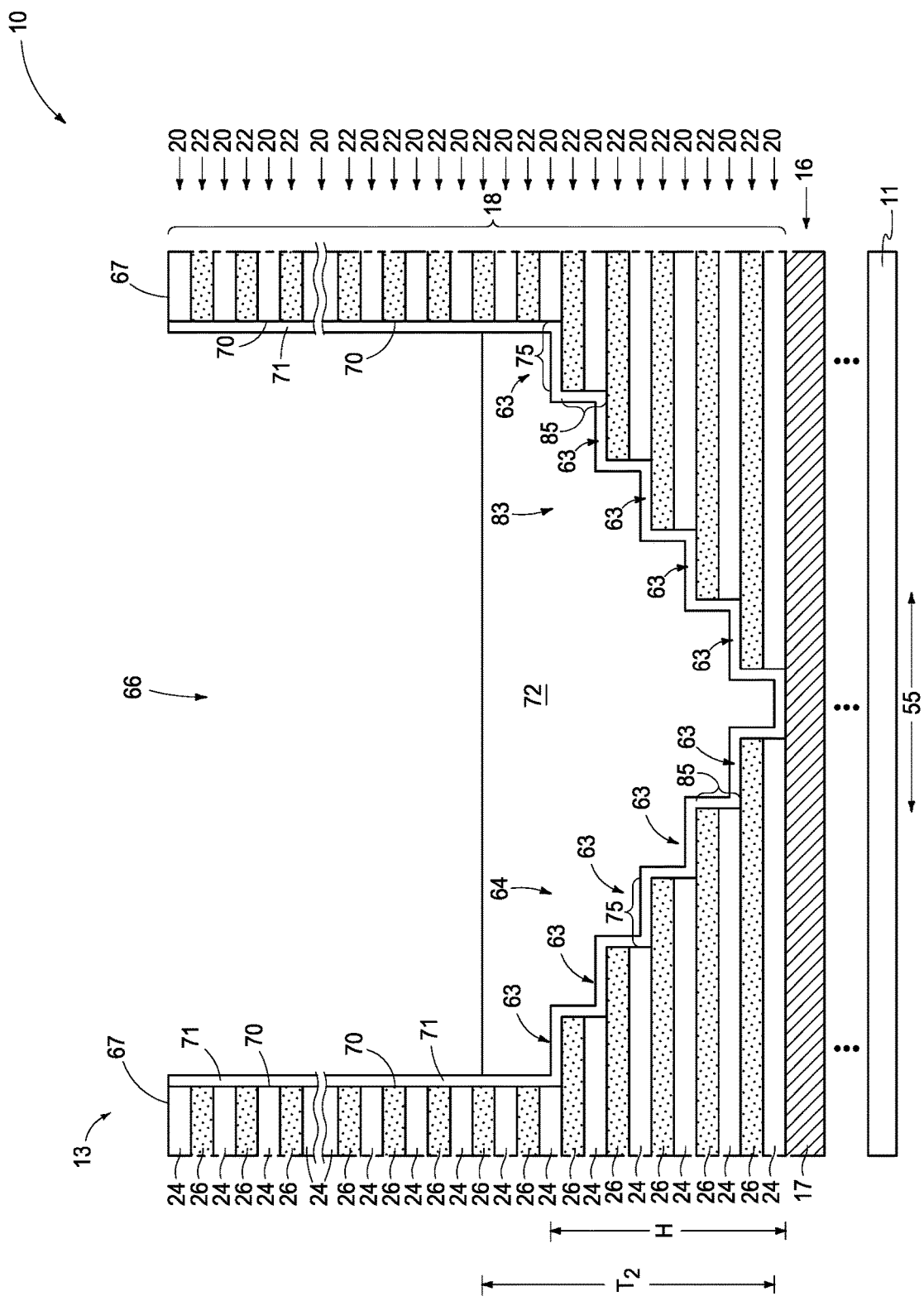

Referring to FIG. 12, an upper portion of insulative material 72 has been removed from cavity 66 to leave insulative material 72 in a bottom of cavity 66 over stair-step structure 64 (e.g., and stair-step structure 83 when present). In one embodiment, such removing comprises etching, with the etching being conducted selectively relative to insulator material 71 and in one such embodiment with a selectivity of at least 10:1 by volume. For example, such etching may be conducted isotropically and wet using HF or using a combination of $NH_3$ and $H_2O_2$ when insulative material 72 is silicon dioxide and insulator material 71 is one or more of $Si_xO_yC_z$, porous carbon, aluminum oxide, and undoped elemental-form silicon. A reason for providing insulator material 71 is to preclude second-tier material 24 from being etched when it is of the same composition as that of insulative material 72. In one embodiment and as shown, the example isotropic etching of FIG. 12 shows removal of opposing lateral projections 76 from cavity 66 and which accordingly are not shown therein. In one embodiment and as shown, the act of removing of the upper portion of insulative material 72 from cavity 66 leaves insulative material 72 to have a thickness $T_2$ that is still greater than height H of stair-step structure 64. In one embodiment as shown where insulative material 72 is also formed atop stack 18 aside cavity 66, the removing of the upper portion of insulative material 72 from cavity 66 leaves some insulative material 72 atop stack 18 aside cavity 66. In one such example embodiment and as shown in FIG. 13, all remaining insulative material 72 has been removed from atop stack 18 aside cavity 66, and in one embodiment such removing comprises chemical mechanical polishing (CMP). An uppermost tier of stack 18 may be formed of a polish-stop material for such CMP.

Figure 14:
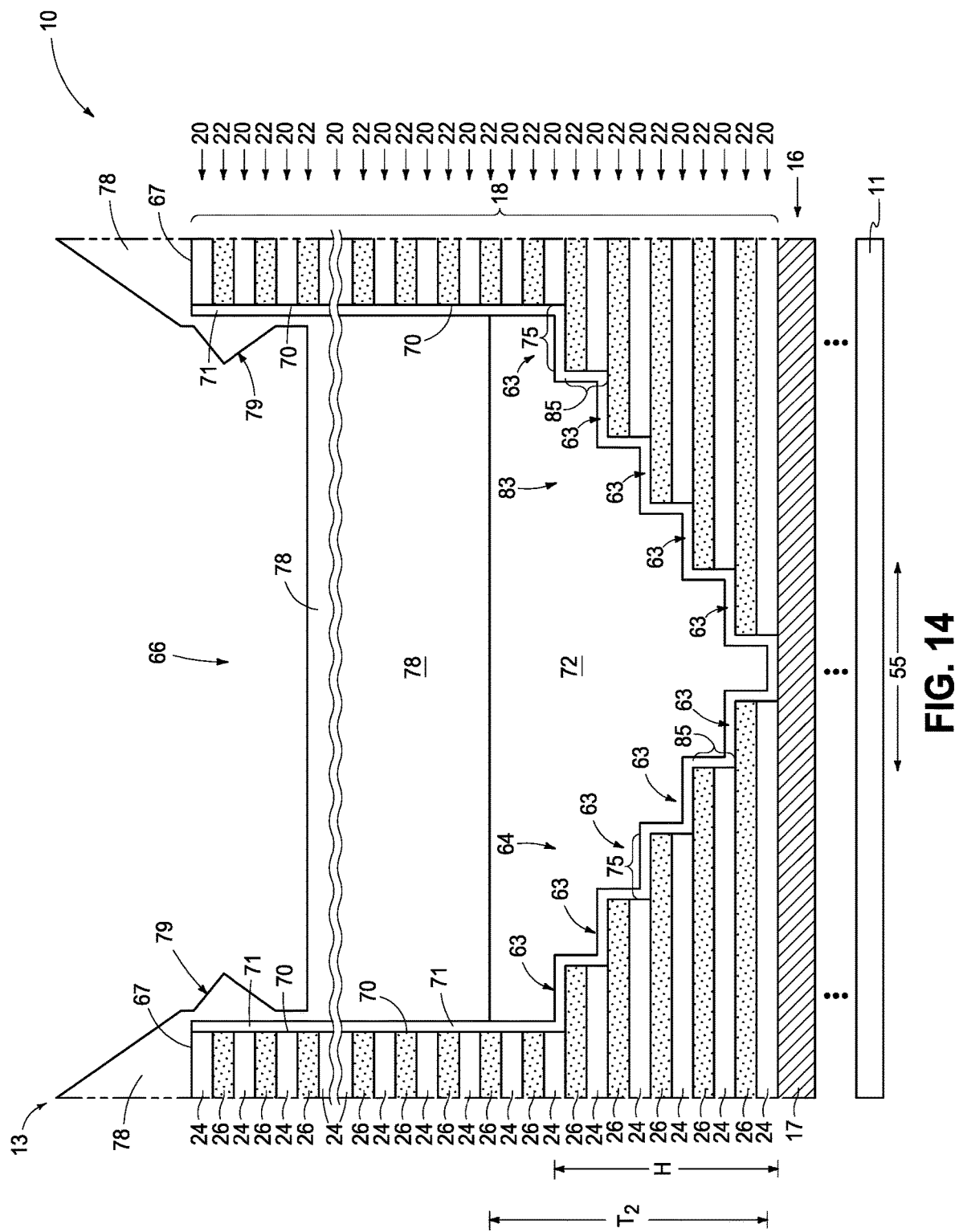
Figure 15:
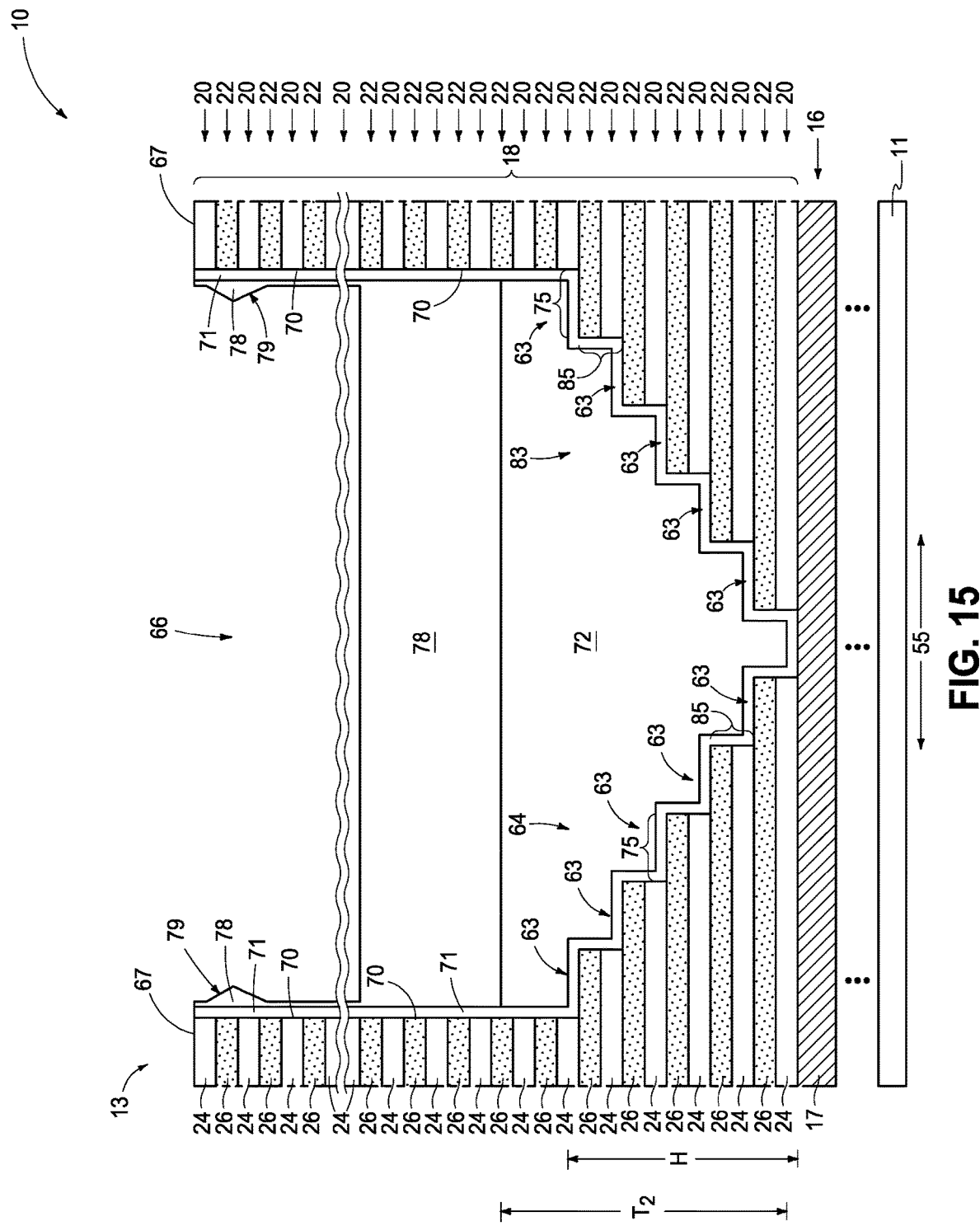
Figure 16:
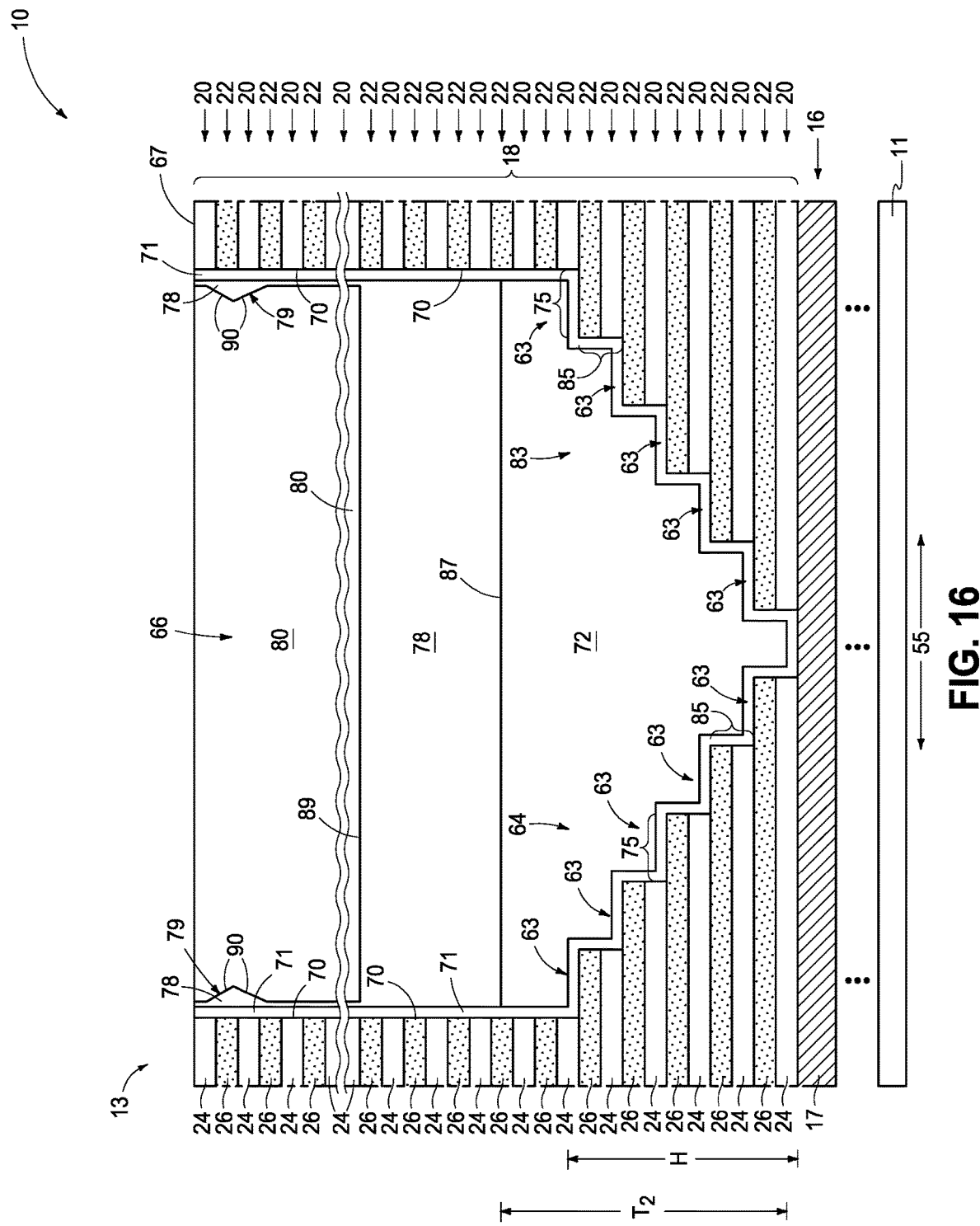

After removing the upper portion of the insulative material from the cavity, insulating material is formed in the cavity above the insulative material. In one such embodiment, the insulating material is formed to fill the cavity above the insulative material. Such may be done in a single deposition step or in at least two time-spaced deposition steps. FIGS. 14-16 are next described with respect to an example embodiment wherein the insulating material is formed to fill the cavity above of the insulative material in two time-spaced deposition steps and in one such embodiment wherein an upper portion of the insulating material from one of the time-spaced deposition steps is removed from the cavity prior to the next time-spaced deposition step.

Referring to FIG. 14, insulating material 78 (that may be of the same or different composition from that of insulative material 72) has been formed in cavity 66 above insulative material 72. A pair of opposing lateral projections 79 may form in cavity 66 in the vertical cross-section as shown. FIG. 15 shows example removing of an upper portion of insulating material 78 from cavity 66 and removing of insulating material 78 from atop stack 18 aside cavity 66 when so-formed (e.g., by anisotropic etching, by isotropic etching, and/or CMP). FIG. 15 shows example processing where all of opposing lateral projections 79 have not been removed from cavity 66 in the vertical cross-section (thus leaving opposing lateral projections 79 therein).

FIG. 16 shows example subsequent processing wherein more insulating material 80 (that may be of the same or different composition from that of insulating material 78) has been formed in another deposition step (and over opposing lateral projections 79), and in one embodiment to completely fill remaining volume of cavity 66. Such may be followed by planarizing insulating material 80 back (e.g., by CMP) to form a planar top surface thereof. In one embodiment and as shown, insulating material 78/80 has been formed to completely fill remaining volume of cavity 66 above insulative material 72. More than two time-spaced deposition steps insulating material may be used (not shown).

In one embodiment and as shown, a seam 89 has been formed which extends laterally across cavity 66 in the vertical cross-section, with insulating material 80 immediately-directly above seam 89 and insulating material 78 immediately-directly below seam 89 being of the same composition relative one another. In one embodiment, a seam 87 extends laterally across the cavity in the vertical cross-section, with material 78 immediately-directly above seam 87 and material 72 immediately-directly below seam 87 being of the same composition relative one another. In one embodiment, insulating material 78/80 in cavity 66 comprises a pair of opposing lateral projections (e.g., 79) in cavity 66 in the vertical cross-section that individually are at least partially characterized by a seam 90 in the vertical cross-section, with insulating material 78/80 that is immediately-directly-laterally-adjacent both sides of seam 90 in the vertical cross-section being of the same composition relative one another.

Figure 17:
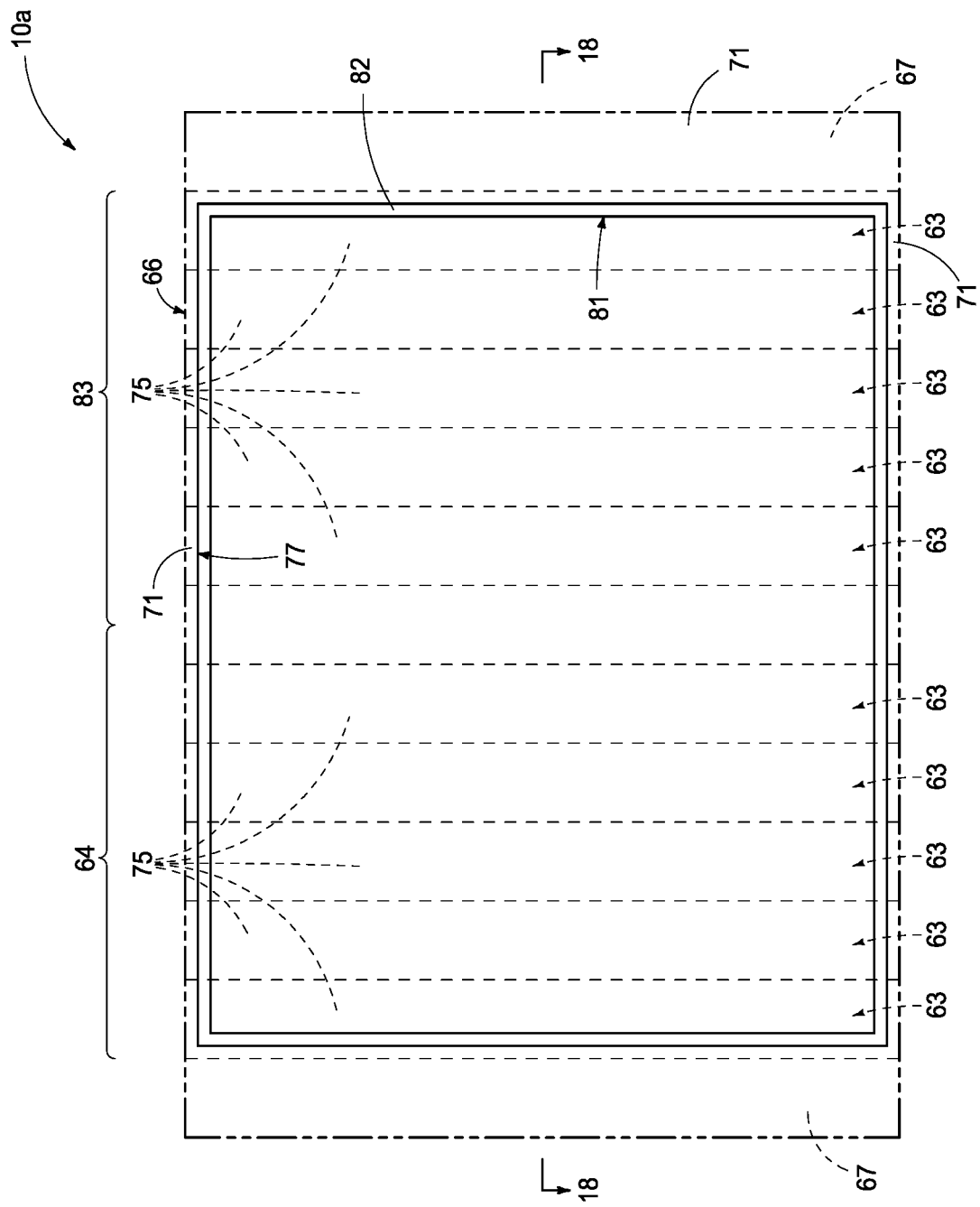
FIGS. 17 and 18 show alternate example methods and/or structural embodiments of the invention.
Figure 18:
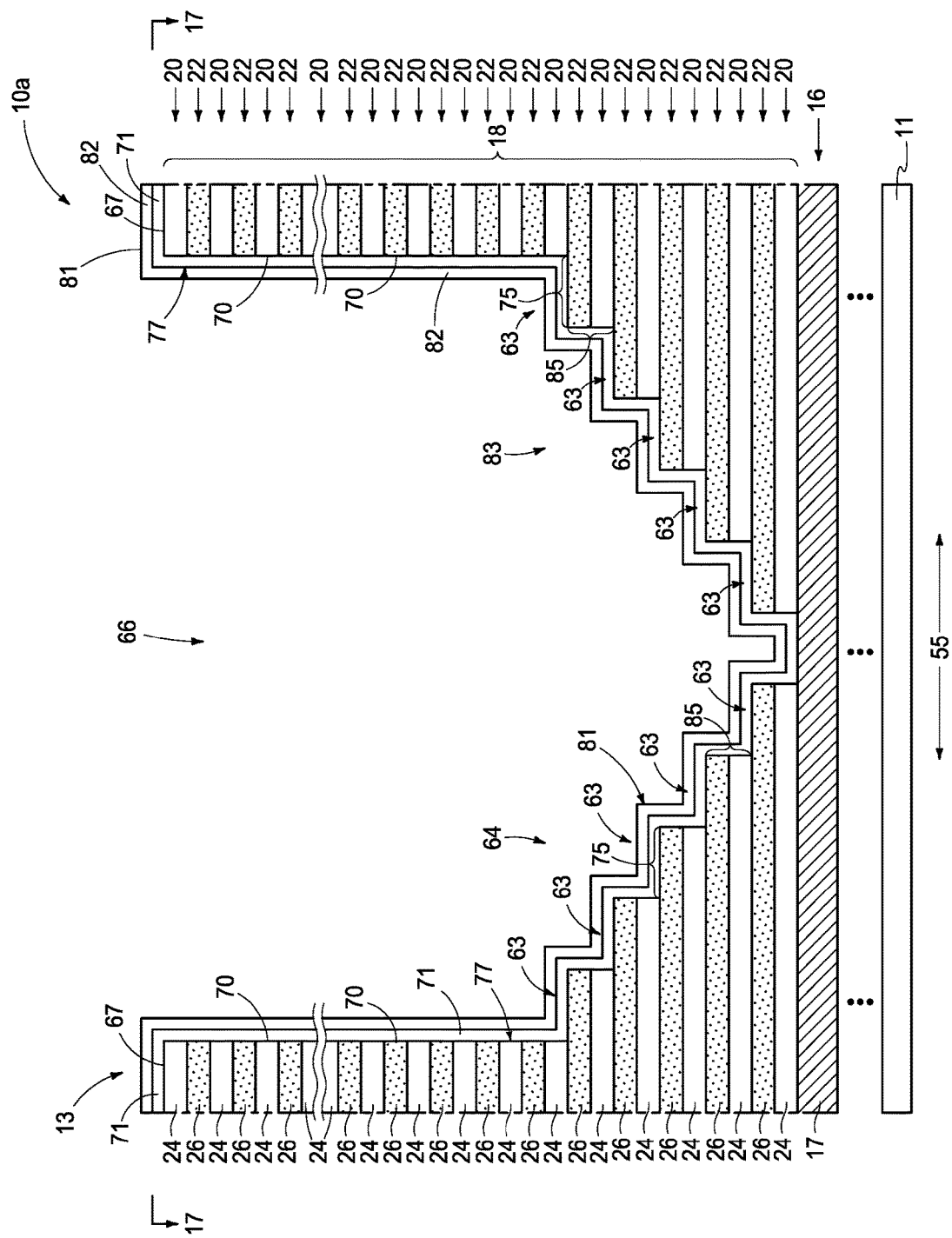

FIGS. 17 and 18 show another example embodiment with respect to processing associated with a construction 10a. Like numerals from the above-described embodiments have been used where appropriate, with some construction differences being indicated with a suffix "a" or with different numerals. FIGS. 17 and 18 correspond in processing sequence to that of FIGS. 8 and 9. FIGS. 17 and 18 may be considered as showing insulator material 71 as comprising a first-insulator-material lining 77 within cavity 66. A second-insulator-material lining 81 has been formed over first-insulator-material lining 77 before forming insulative material 72 (from FIGS. 10 and 11 and to-be-formed) in cavity 66. Second-insulator-material lining 81 comprises second insulator material 82 that is a different composition from insulator material 71 of first-insulator-material lining 77. In one embodiment, second insulator material 82 and insulative material 72 (from FIGS. 10 and 11 and to-be-formed) are of the same composition relative one another. A reason for providing second-insulator-material lining 81 in addition to and over a first-insulator-material lining 77 is to protect against erosion/removal of lining 77 that might otherwise occur of insulator material 71, for example during the deposition of insulative material 72. As an example, high-density-plasma-deposited silicon dioxide 72 as described above has a sputter-etching component that during deposition may remove some of insulator material 71. To prevent or at least reduce such, a second-insulator-material lining 81 may be provided as shown. Processing may otherwise occur after that shown by FIGS. 17 and 18 as described above. Opposing lateral projections 76 and/or 79 may or may not be formed and, if so, may or may not be removed. Any other attribute(s) or aspect(s) as shown and/or described herein with respect to other embodiments may be used.

Figure 19:
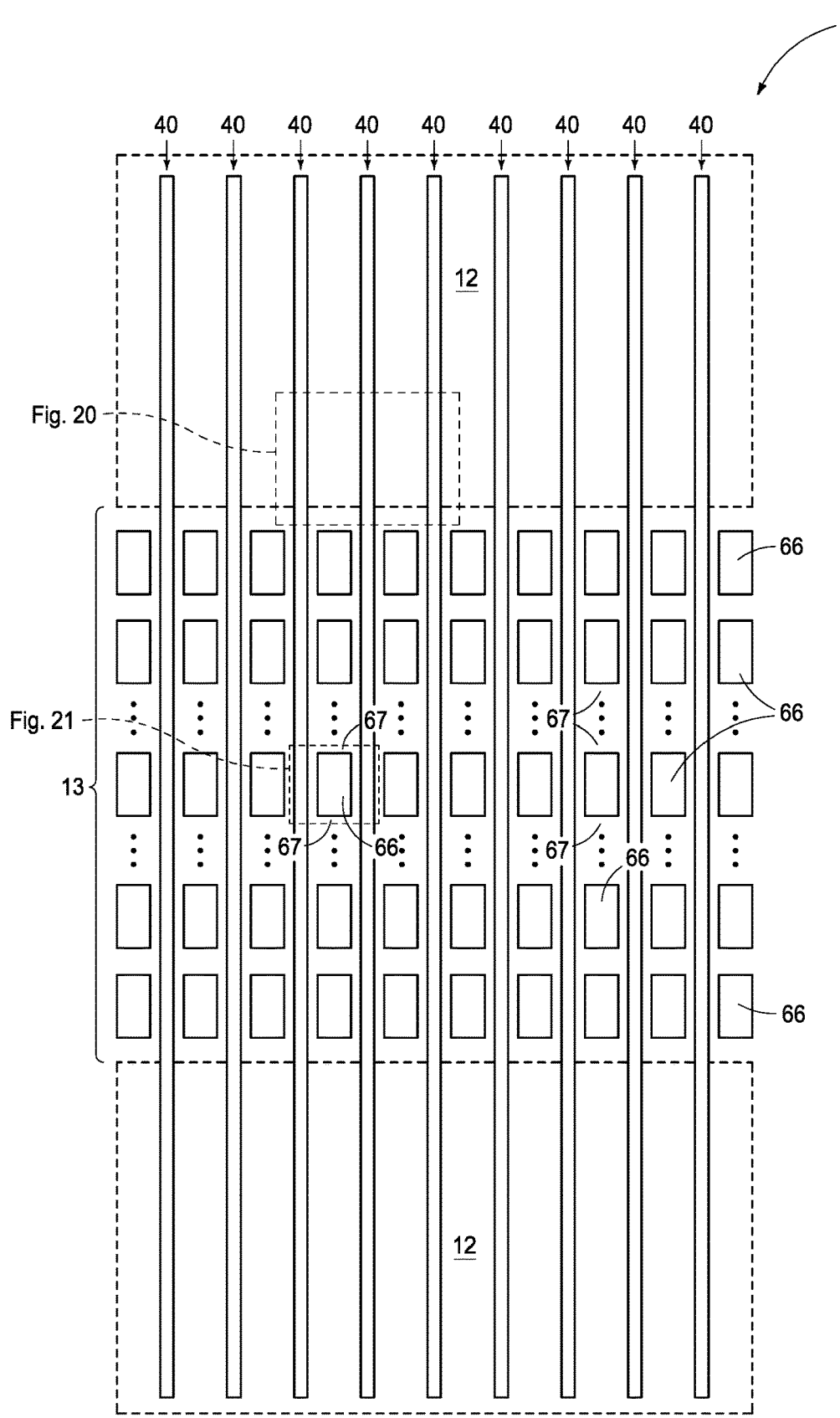
Figure 20:
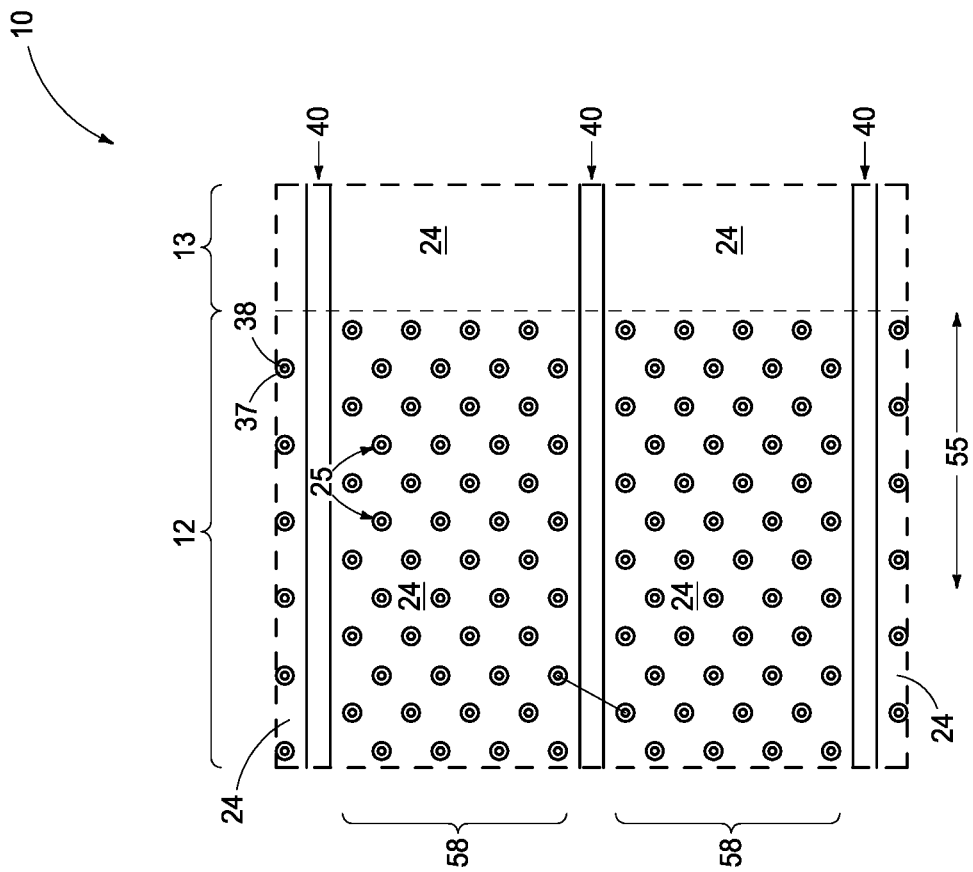
Figure 21:
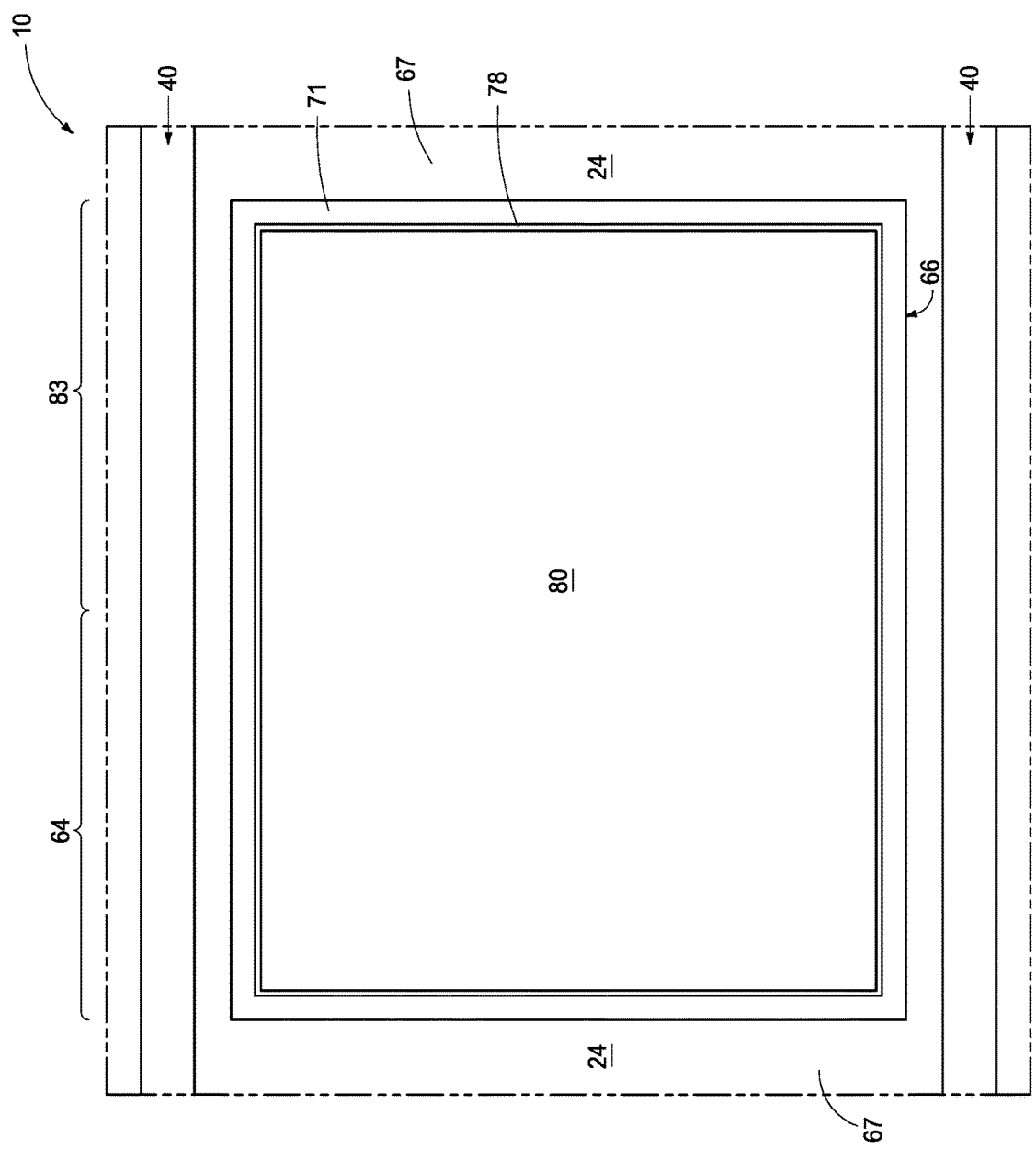
Figure 22:
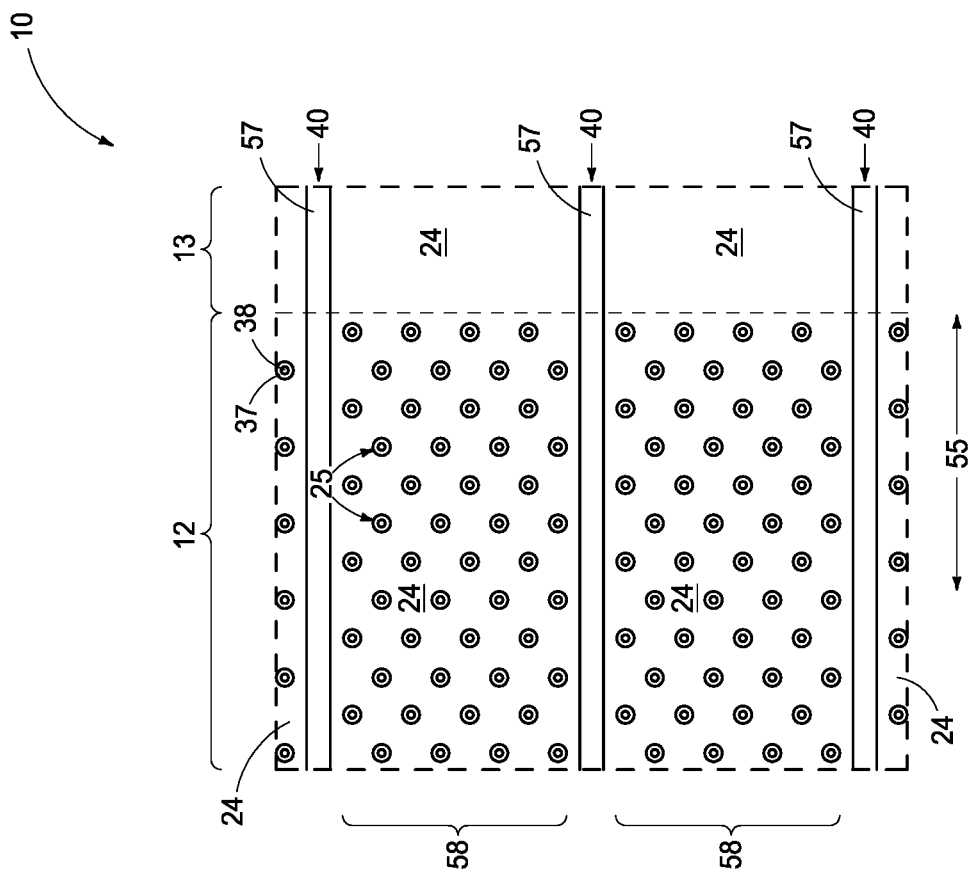
Figure 23:
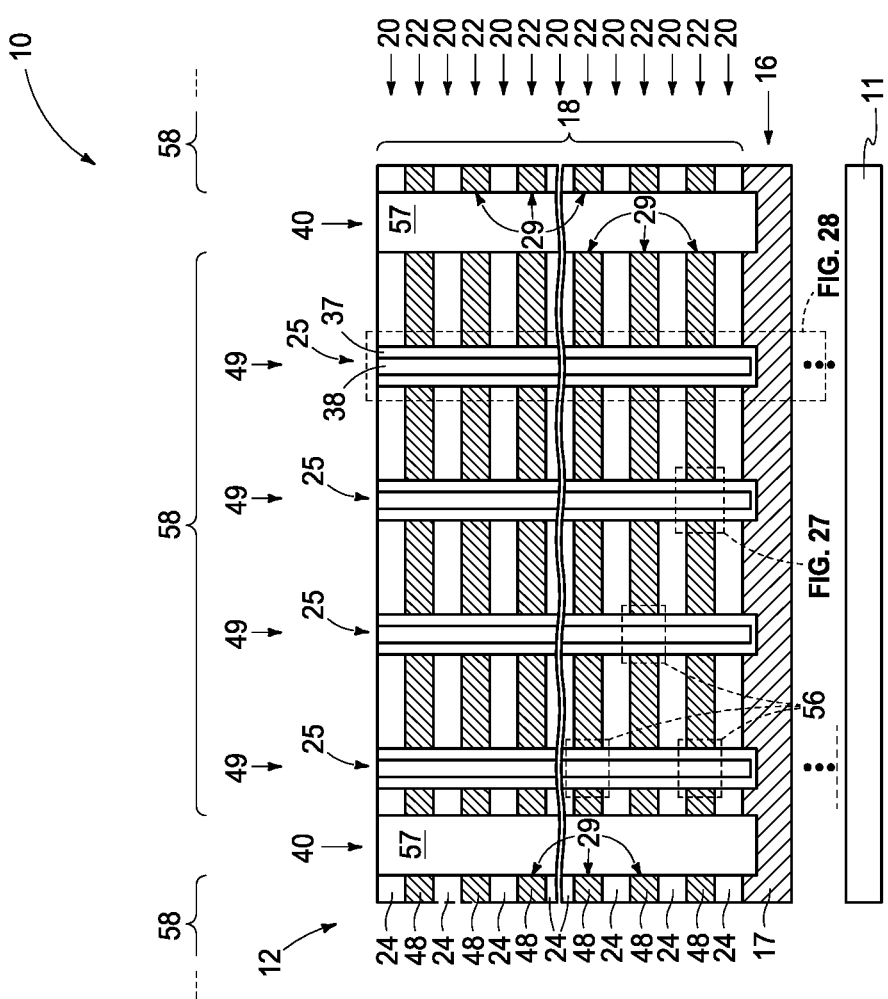
Figure 24:
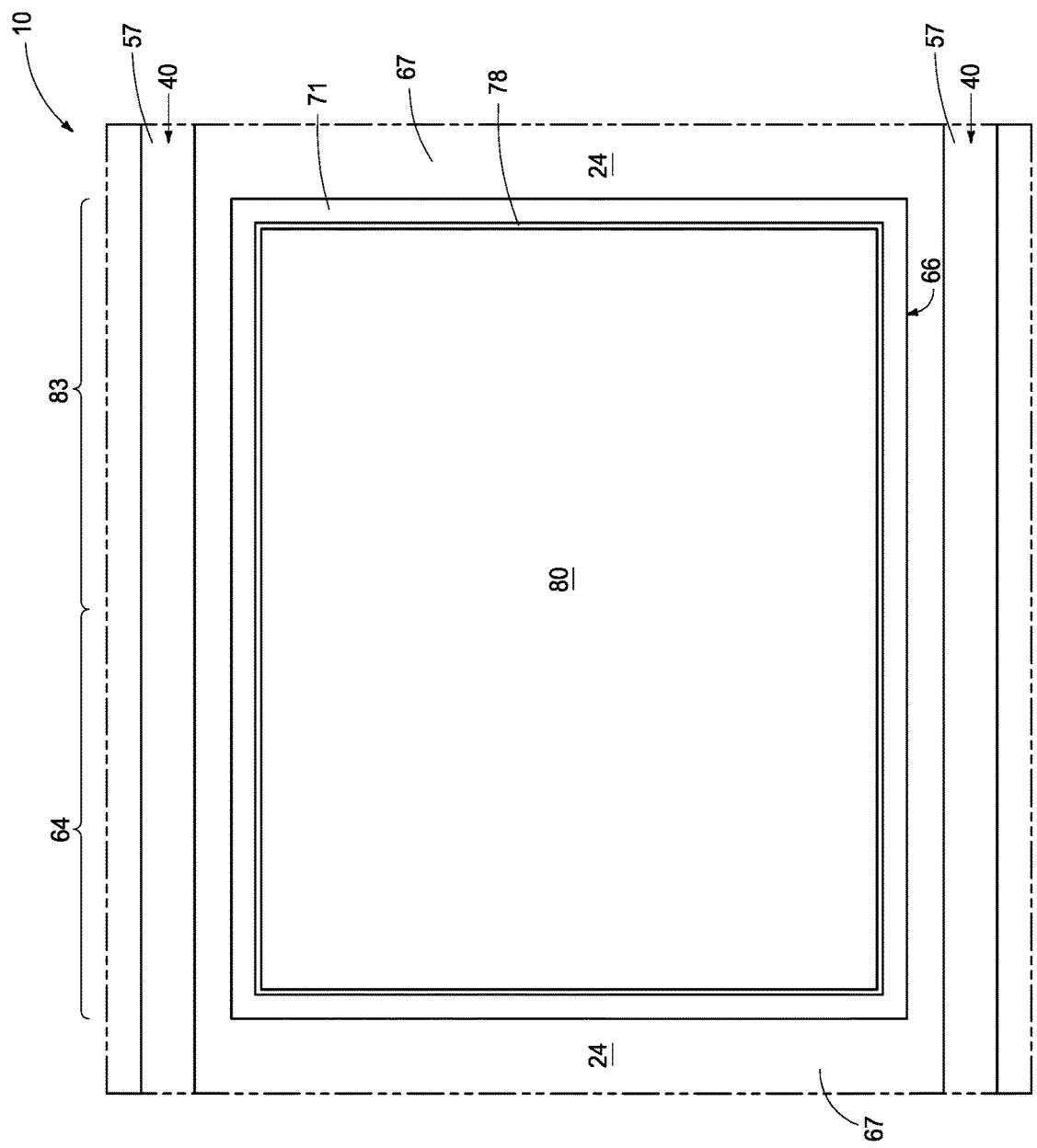
Figure 25:
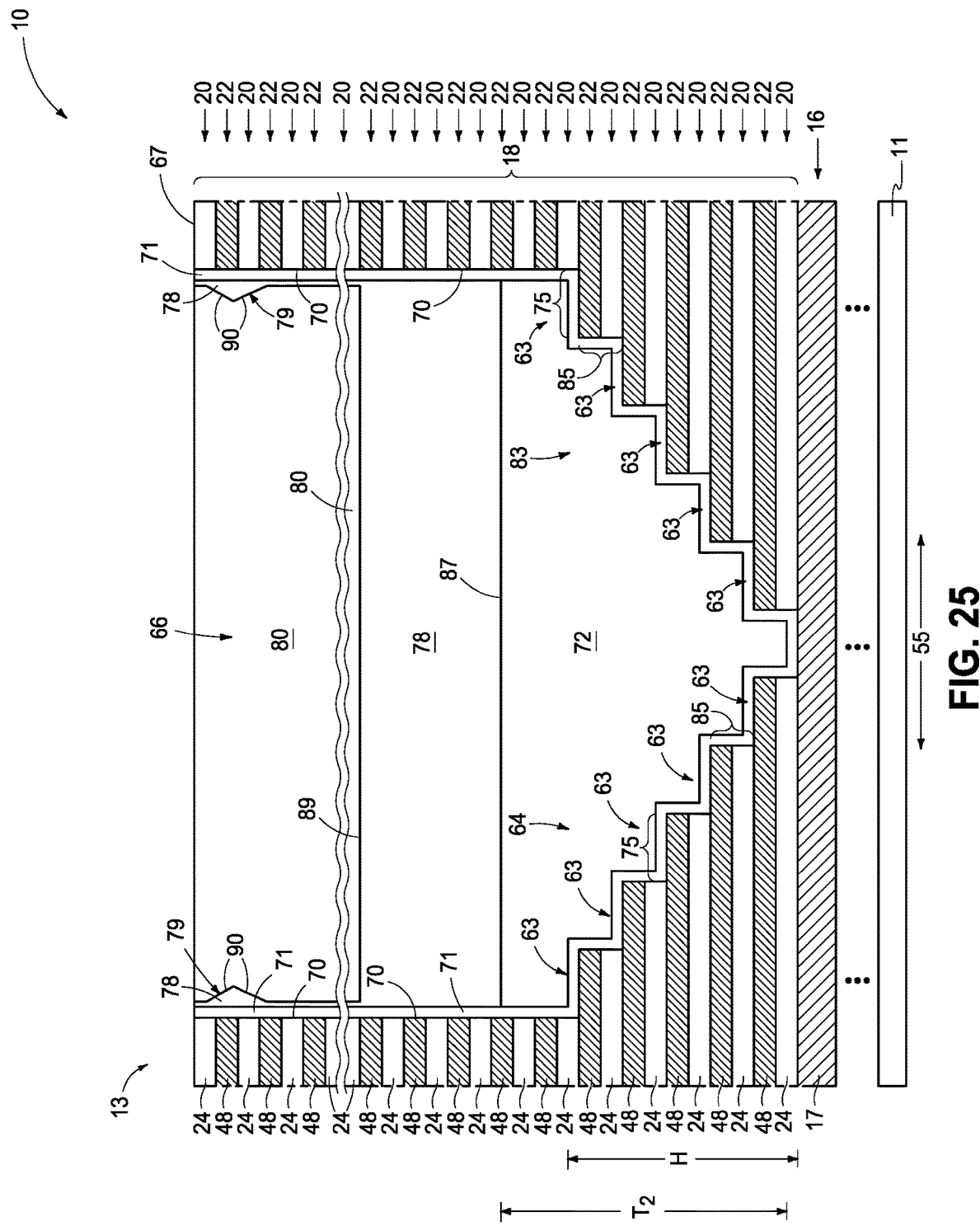
Figure 28:
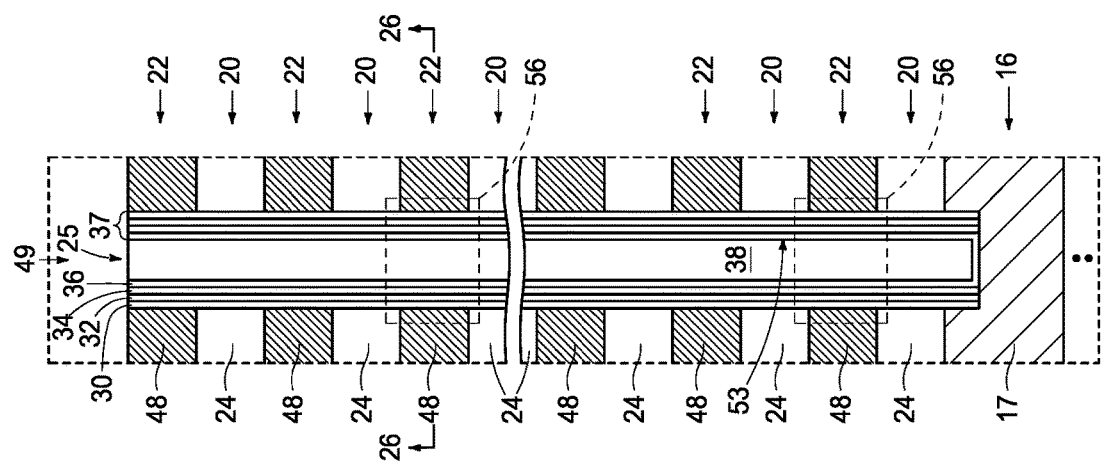
Figure 26:
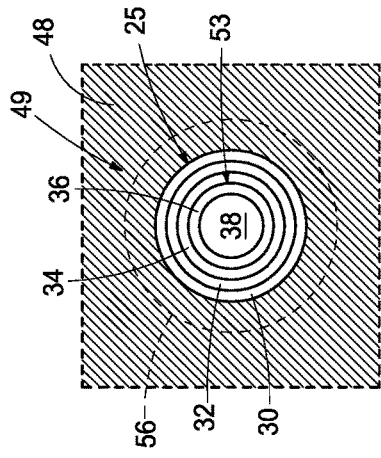
Figure 27:
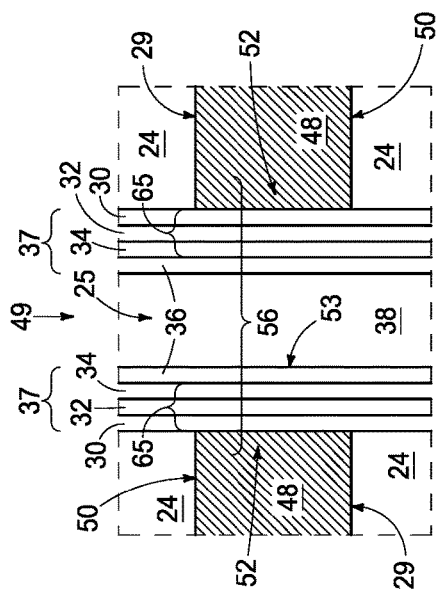

Referring to FIGS. 19-21, horizontally-elongated trenches 40 have been formed into stack 18 to form laterally-spaced memory-block regions 58 extending from memory-array region 12 into stair-step region 13. Conductive vias (not shown) to steps 63 and through-array-vias (TAV's, and not shown) in stair-step region 13 may be formed before or after forming trenches 40.

Referring to FIGS. 22-28, and in one embodiment, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56. Treads 75 may be considered as individually comprising an uppermost conductive surface.

A thin insulative liner (e.g., $Al_2O_3$ and not shown) may be formed before forming conducting material 48. Approximate locations of transistors and/or memory cells 56 are indicated with a bracket in FIG. 27 and some with dashed outlines in FIGS. 23, 26, and 28, with transistors and/or memory cells 56 being essentially ring-like or annular in the depicted example. Alternately, transistors acid/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 27) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conducting material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed laterally-between and longitudinally-along immediately-laterally-adjacent memory blocks 58. Intervening material 57 may provide lateral electrical isolation (insulation) between immediately-laterally-adjacent memory-blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass existing or future-developed integrated circuitry independent of method of manufacture. Nevertheless, such circuitry may have any of the attributes as described herein in method embodiments. Likewise, the above-described method embodiments may incorporate, form, and/or have any of the attributes described with respect to device embodiments.

In one embodiment, integrated circuitry in accordance with an embodiment of the invention comprises a three-dimensional (3D) array (e.g., 12) comprising tiers of electronic components (e.g., 56). The circuitry comprises a cavity (e.g., 66) comprising a stair-step structure (e.g., 64 or 83) laterally-adjacent the 3D array. Insulating material (e.g., 71, 72, 78, 80, 82) is in the cavity above the stair-step structure. The insulating material comprises a radially-inner insulative material (e.g., 72, 78, 80, 82) and a radially-outer insulator material (e.g., 71) radially outside of the radially-inner insulative material, with the radially-inner insulative material and the radially-outer insulator material being of different compositions relative one another. In one embodiment, a seam (e.g., 89, 87) extends laterally across the cavity in the radially-inner insulative material in a vertical cross-section (e.g., that of FIG. 25), with the radially-inner insulative material immediately-directly above the seam (e.g., 78 relative to seam 87 and 80 relative to seam 89) and the radially-inner insulative material immediately-directly below the seam (e.g., 72 relative to seam 87 and 78 relative to seam 89) being of the same composition relative one another. In one embodiment, a pair of opposing lateral projections (e.g., 79) is in the cavity in the radially-inner insulative material in a vertical cross-section (e.g, that of FIG. 25), with the opposing lateral projections individually being at least partially characterized by a seam (e.g., 90) in the vertical cross-section, with the radially-inner insulating material (e.g., 78/80) that is immediately-directly-laterally-adjacent both sides of the seam in the vertical cross-section being of the same composition relative one another. Any other attribute(s) or aspect(s) as shown and/or described herein with respect to other embodiments may be used.

In one embodiment, integrated circuitry in accordance with an embodiment of the invention comprises a three-dimensional (3D) array (e.g., 12) comprising tiers of electronic components (e.g., 56). The circuitry comprises a cavity (e.g., 66) comprising a stair-step structure (e.g., 64 or 83) laterally-adjacent the 3D array. Insulating material (e.g., 71, 72, 78, 80, 82) is in the cavity above the stair-step structure. The insulating material comprises a seam (e.g., 89, 87) extending laterally across the cavity in a vertical cross-section (e.g., that of FIG. 25). The insulating material that is immediately-directly above (e.g., 78 relative to seam 87 and 80 relative to seam 89) and the insulating material that is immediately-directly below (e.g., 72 relative to seam 87 and 78 relative to seam 89) the laterally-extending seam are of the same composition relative one another. Any other attribute(s) or aspect(s) as shown and/or described herein with respect to other embodiments may be used.

In one embodiment, integrated circuitry in accordance with an embodiment of the invention comprises a three-dimensional (3D) array (e.g., 12) comprising tiers of electronic components (e.g., 56). The circuitry comprises a cavity (e.g., 66) comprising a stair-step structure (e.g., 64 or 83) laterally-adjacent the 3D array. Insulating material (e.g., 71, 72, 78, 80, 82) is in the cavity above the stair-step structure. The insulating material comprises a pair of opposing lateral projections (e.g., 79) in the cavity in a vertical cross-section (e.g., that of FIG. 25). The opposing lateral projections individually are at least partially characterized by a seam (e.g., 90) in the vertical cross-section. The insulating material (e.g., 78/80) that is immediately-directly-laterally-adjacent both sides of the seam in the vertical cross-section are of the same composition relative one another. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component, that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming a stack comprising vertically-alternating first tiers and second tiers. The stack comprises a cavity therein that comprises a stair-step structure. Sidewalls of the cavity and steps of the stair-step structure are lined with an insulator material. Insulative material is formed in the cavity radially inward of the insulator material. An upper portion of the insulative material is removed from the cavity to leave the insulative material in a bottom of the cavity over the stair-step structure. After the removing, insulating material is formed in the cavity above the insulative material.

In some embodiments, a method used in forming a memory array comprising strings of memory cells comprises forming a stack comprising vertically-alternating first tiers and second tiers. The stack comprises a memory-array region and a stair-step region. A cavity is formed that comprises a stair-step structure in the stack in the stair-step region. Sidewalk of the cavity and steps of the stair-step structure are lined with an insulator material. Insulative material is formed in the cavity radially inward of the insulator material. An upper portion of the insulative material is removed from the cavity to leave the insulative material in a bottom of the cavity over the stair-step structure. After the removing, insulating material is formed in the cavity above the insulative material. Channel-material strings of memory cells are formed through the first and second tiers in the memory-array region. Horizontally-elongated trenches are formed into the stack to form laterally-spaced memory-block regions extending from the memory-array region into the stair-step region.

In some embodiments, integrated circuitry comprises a three-dimensional (3D) array comprising tiers of electronic components. A cavity comprising a stair-step structure is laterally-adjacent the 3D array. Insulating material is in the cavity above the stair-step structure. The insulating material comprises a radially-inner insulative material and a radially-outer insulator material radially outside of the radially-inner insulative material. The radially-inner insulative material and the radially-outer insulator material are of different compositions relative one another.

In some embodiments, integrated circuitry comprises a three-dimensional (3D) array comprising tiers of electronic components. A cavity comprising a stair-step structure is laterally-adjacent the 3D array. Insulating material is in the cavity above the stair-step structure. The insulating material comprises a seam that extends laterally across the cavity in a vertical cross-section. The insulating material that is immediately-directly above and the insulating material that is immediately-directly below the laterally-extending seam are of the same composition relative one another.

In some embodiments, integrated circuitry comprises a three-dimensional (3D) array comprising tiers of electronic components. A cavity comprising a stair-step structure is laterally-adjacent the 3D array. Insulating material is in the cavity above the stair-step structure. The insulating material comprises a pair of opposing lateral projections in the cavity in a vertical cross-section. The opposing lateral projections individually are at least partially characterized by a seam in the vertical cross-section. The insulating material that is immediately-directly-laterally-adjacent both sides of the seam in the vertical cross-section is of the same composition relative one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
   forming a stack comprising vertically-alternating first tiers and second tiers, the stack comprising a cavity therein that comprises a stair-step structure;
   lining sidewalls of the cavity and steps of the stair-step structure with an insulator material;
   forming insulative material in the cavity radially inward of the insulator material;
   removing an upper portion of the insulative material from the cavity to leave the insulative material in a bottom of the cavity over the stair-step structure;
   after the removing, forming insulating material above the stack and in the cavity above the insulative material; and
   the insulating material in the cavity comprising a pair of opposing lateral projections in the cavity in a vertical cross-section, the opposing lateral projections being below an uppermost surface of the stack and projecting laterally away from the sidewalls of the cavity and laterally toward one another within the cavity.

2. The method of claim 1 wherein the opposing lateral projections individually are at least partially characterized by a seam in the vertical cross-section, the insulating material that is immediately-directly-laterally-adjacent both sides of the seam in the vertical cross-section being of the same composition relative one another.

3. The method of claim 1 comprising removing the pair of opposing lateral projections.

4. The method of claim 1 wherein at least some of the pair of opposing lateral projections remain in a finished circuitry construction.

5. The method of claim 4 comprising, after forming the pair of opposing lateral projections, reducing degree to which the pair of opposing lateral projections project laterally away from the sidewalls of the cavity and laterally toward one another within the cavity.

6. The method of claim 1 wherein the insulating material is formed in at least two time-spaced deposition steps, the pair of opposing lateral projections being formed in an earlier-in-time of the at least two time-spaced deposition steps.

7. The method of claim 1 wherein the insulating material is formed in at least two time-spaced deposition steps, the pair of opposing lateral projections being formed in a later-in-time of the at least two time-spaced deposition steps.

8. The method of claim 1 wherein,
   the insulating material is formed in at least two time-spaced deposition steps, the pair of opposing lateral projections being a first pair of opposing lateral projections formed in an earlier-in-time of the at least two time-spaced deposition steps; and
   further comprising:
   forming a second pair of opposing lateral projections in the cavity in the vertical cross-section in a later-in-time of the at least two time-spaced deposition steps, the second pair of opposing lateral projections being below an uppermost surface of the stack and projecting laterally away from the sidewalls of the cavity and laterally toward one another within the cavity.

9. The method of claim 8 wherein at least some of the second pair of opposing lateral projections remain in a finished circuitry construction.

10. The method of claim 8 comprising removing the first pair of opposing lateral projections before forming the second pair of opposing lateral projections.

11. The method of claim 10 wherein at least some of the second pair of opposing lateral projections remain in a finished circuitry construction.

12. The method of claim 11 comprising, after forming the second pair of opposing lateral projections, reducing degree to which the second pair of opposing lateral projections project laterally away from the sidewalls of the cavity and laterally toward one another within the cavity.

* * * * *